(12) United States Patent
Kim et al.

(10) Patent No.: US 12,324,166 B2
(45) Date of Patent: Jun. 3, 2025

(54) RESISTIVE MEMORY DEVICE

(71) Applicant: SAMSUNG ELECTRONICS CO., LTD., Suwon-si (KR)

(72) Inventors: Chungman Kim, Suwon-si (KR); Bonwon Koo, Suwon-si (KR); Dongho Ahn, Hwaseong-si (KR); Kiyeon Yang, Seoul (KR); Zhe Wu, Seoul (KR); Chang Seung Lee, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 822 days.

(21) Appl. No.: 17/568,866

(22) Filed: Jan. 5, 2022

(65) Prior Publication Data
US 2022/0406844 A1    Dec. 22, 2022

(30) Foreign Application Priority Data

Jun. 16, 2021  (KR) .................. 10-2021-0078289

(51) Int. Cl.
*H10B 63/00* (2023.01)
*H10B 63/10* (2023.01)
*H10N 70/00* (2023.01)
*H10N 70/20* (2023.01)
*G11C 13/00* (2006.01)

(52) U.S. Cl.
CPC ............ *H10B 63/24* (2023.02); *H10B 63/10* (2023.02); *H10B 63/84* (2023.02); *H10N 70/231* (2023.02); *H10N 70/826* (2023.02); *H10N 70/8825* (2023.02); *G11C 13/0004* (2013.01); *G11C 13/003* (2013.01); *G11C 2213/72* (2013.01)

(58) Field of Classification Search
CPC ........ H10B 63/24; H10B 63/10; H10B 63/84; H10N 70/231; H10N 70/826; H10N 70/8825; G11C 13/0004; G11C 13/003; G11C 2213/72
See application file for complete search history.

(56) References Cited

U.S. PATENT DOCUMENTS

| | | | |
|---|---|---|---|
| 7,277,313 | B2 | 10/2007 | Campbell et al. |
| 9,379,321 | B1 | 6/2016 | Chang et al. |
| 9,653,683 | B2 | 5/2017 | Cheng et al. |
| 10,099,957 | B2 | 10/2018 | Carlie |

(Continued)

FOREIGN PATENT DOCUMENTS

| | | |
|---|---|---|
| JP | 2020-176297 A | 10/2020 |
| KR | 10-2018-0057977 A | 5/2018 |
| KR | 10-2188583 B1 | 12/2020 |

*Primary Examiner* — Earl N Taylor
(74) *Attorney, Agent, or Firm* — FINNEGAN, HENDERSON, FARABOW, GARRETT & DUNNER LLP

(57) ABSTRACT

A resistive memory device including a resistive memory pattern; and a selection element pattern electrically connected to the resistive memory pattern, the selection element pattern including a chalcogenide switching material and at least one metallic material, the chalcogenide switching material including germanium, arsenic, and selenium, and the at least one metallic material including aluminum, strontium, or indium, wherein the selection element pattern includes an inhomogeneous material layer in which content of the at least one metallic material in the selection element pattern is variable according to a position within the selection element pattern.

20 Claims, 28 Drawing Sheets

(56) References Cited

U.S. PATENT DOCUMENTS

| | | |
|---|---|---|
| 10,128,312 B2 | 11/2018 | Wu et al. |
| 10,163,977 B1 | 12/2018 | Fantini et al. |
| 2017/0271408 A1 | 9/2017 | Yang et al. |
| 2018/0019281 A1 | 1/2018 | Lee et al. |
| 2020/0075675 A1 | 3/2020 | Wu et al. |
| 2020/0365801 A1* | 11/2020 | Yu .................... H10N 70/026 |
| 2020/0411759 A1 | 12/2020 | Sei et al. |
| 2021/0193922 A1* | 6/2021 | Lee ..................... H10B 63/20 |
| 2021/0384427 A1* | 12/2021 | Park .................. H10N 70/068 |
| 2021/0391385 A1* | 12/2021 | Kim .................. H10D 84/834 |
| 2021/0399220 A1* | 12/2021 | Moon ................ H10N 70/841 |
| 2022/0005869 A1* | 1/2022 | Kim ........................ G11C 7/12 |
| 2022/0013171 A1* | 1/2022 | Terai .................. H10N 70/821 |
| 2022/0013581 A1* | 1/2022 | Ha ...................... H10B 63/20 |
| 2022/0013722 A1* | 1/2022 | Jung ................... H10B 63/24 |
| 2022/0020817 A1* | 1/2022 | Yang ................ H10N 70/8828 |
| 2022/0037401 A1* | 2/2022 | Park ..................... H10B 63/80 |
| 2022/0052113 A1* | 2/2022 | Lee .................. H10N 70/8825 |
| 2022/0052116 A1* | 2/2022 | Lee ...................... H10B 63/24 |
| 2022/0059522 A1* | 2/2022 | Han ...................... H10D 89/10 |
| 2022/0069011 A1* | 3/2022 | Ahn .................... H10N 70/882 |
| 2022/0085105 A1* | 3/2022 | Park .................. H10N 70/826 |
| 2022/0085286 A1* | 3/2022 | Park .................. H10N 70/826 |
| 2022/0115442 A1* | 4/2022 | Bae ..................... H10N 70/011 |
| 2022/0122658 A1* | 4/2022 | Lee .................... G11C 13/0028 |
| 2022/0129158 A1* | 4/2022 | Kim ..................... G06F 12/0882 |
| 2022/0139821 A1* | 5/2022 | Hwang .............. H01L 23/5228 |
| | | 257/324 |
| 2022/0156008 A1* | 5/2022 | Lee ....................... G06F 3/0679 |
| 2022/0190242 A1* | 6/2022 | Kim ..................... H10B 63/20 |
| 2022/0216402 A1* | 7/2022 | Yoon ................. H10N 70/882 |
| 2022/0271091 A1* | 8/2022 | Kim ..................... H10B 63/24 |
| 2022/0293680 A1* | 9/2022 | Han .................... H10B 63/84 |
| 2022/0310698 A1* | 9/2022 | Park .................... H10B 63/20 |
| 2022/0380390 A1* | 12/2022 | Kim .................. H10N 70/826 |

\* cited by examiner

RESISTIVE MEMORY DEVICE

CROSS-REFERENCE TO RELATED APPLICATION

This application is based on and claims priority under 35 U.S.C. § 119 to Korean Patent Application No. 10-2021-0078289, filed on Jun. 16, 2021, in the Korean Intellectual Property Office, the disclosure of which is incorporated by reference herein in its entirety.

BACKGROUND

1. Field

Embodiments relate to a resistive memory device.

2. Description of the Related Art

A resistive memory device having a three-dimensional (3D) cross-point stack structure, in which a memory cell is at an intersection between two electrodes intersecting with each other, has been considered.

SUMMARY

The embodiments may be realized by providing a resistive memory device including a resistive memory pattern; and a selection element pattern electrically connected to the resistive memory pattern, the selection element pattern including a chalcogenide switching material and at least one metallic material, the chalcogenide switching material including germanium, arsenic, and selenium, and the at least one metallic material including aluminum, strontium, or indium, wherein the selection element pattern includes an inhomogeneous material layer in which content of the at least one metallic material in the selection element pattern is variable according to a position within the selection element pattern.

The embodiments may be realized by providing a resistive memory device including a first conductive line extending lengthwise in a first lateral direction on a substrate; a second conductive line extending lengthwise in a second lateral direction on the substrate, the second lateral direction intersecting with the first lateral direction; and a memory cell at an intersection between the first conductive line and the second conductive line, the memory cell being connected between the first conductive line and the second conductive line, wherein the memory cell includes a resistive memory pattern; and a selection element pattern electrically connected to the resistive memory pattern, the selection element pattern includes a chalcogenide switching material and a metallic material, the chalcogenide switching material including germanium, arsenic, and selenium, and the metallic material including aluminum, strontium, or indium, and wherein the selection element pattern includes an inhomogeneous material layer in which content of the metallic material is variable according to a position within the selection element pattern.

The embodiments may be realized by providing a resistive memory device including a first conductive line extending lengthwise in a first lateral direction on a substrate; a plurality of second conductive lines extending lengthwise in a second lateral direction on the substrate, the plurality of second conductive lines being spaced apart from the first conductive line in a vertical direction, the second lateral direction intersecting with the first lateral direction; a plurality of memory cells at a plurality of intersections between the first conductive line and the plurality of second conductive lines, the plurality of memory cells being arranged in a line in the first lateral direction on the first conductive line; and an insulating structure covering sidewalls of each of the plurality of memory cells, wherein each of the plurality of memory cells includes a resistive memory pattern; and a selection element pattern electrically connected to the resistive memory pattern, the selection element pattern including a chalcogenide switching material including germanium, arsenic, and selenium, a first metallic material including aluminum, strontium, or indium, and a second metallic material including tungsten, titanium, or copper, and wherein the selection element pattern includes an inhomogeneous material layer in which content of the first metallic material is variable according to a position within the selection element pattern.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
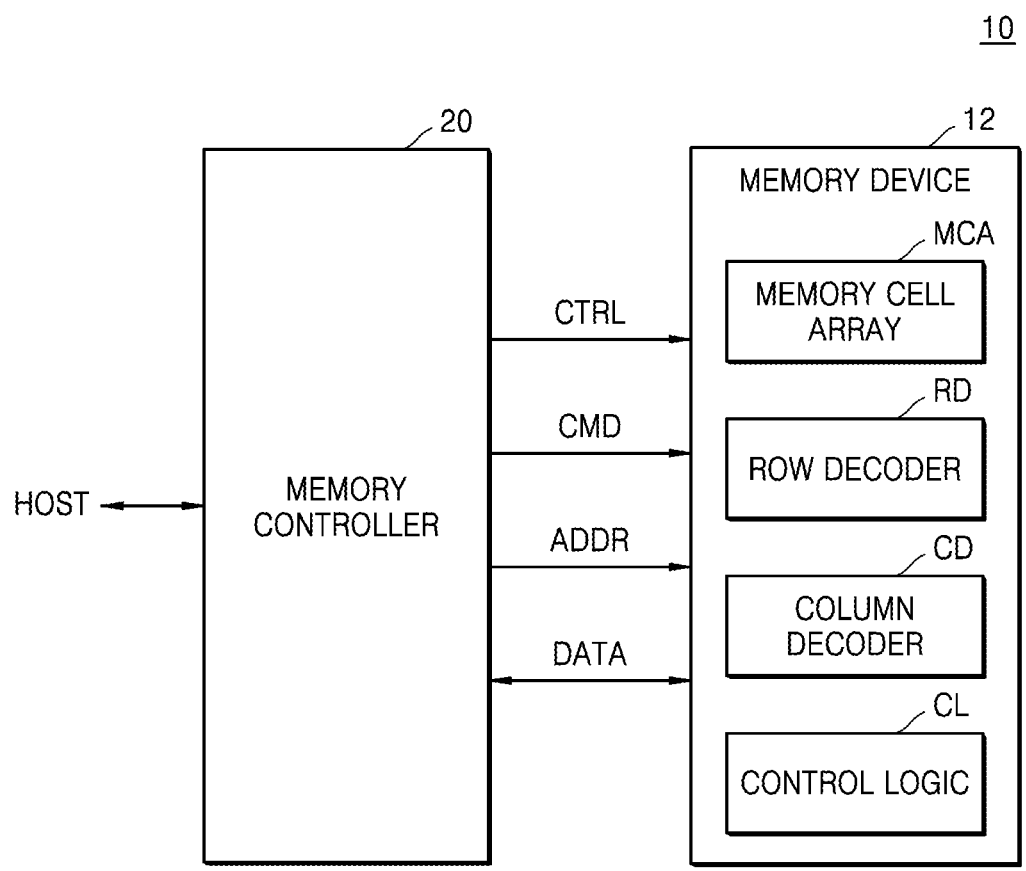
FIG. 1 is a block diagram of a memory system including a resistive memory device, according to embodiments.

FIG. 1 is a block diagram of a memory system 10 including a resistive memory device, according to embodiments.

Referring to FIG. 1, the memory system 10 may include a memory device 12 and a memory controller 20. The memory device 12 may include a memory cell array MCA, a row decoder RD, a column decoder CD, and a control logic CL.

The memory controller 20 may control the memory device 12 to read data stored in the memory device 12 or write data to the memory device 12 in response to a write/read request from a host HOST. The memory controller 20 may control a program (or write) operation, a read operation, and an erase operation on the memory device 12 by providing an address ADDR, a command CMD, and a control signal CTRL to the memory device 12. In addition, data DATA to be written and read data DATA may be transmitted and received between the memory controller 20 and the memory device 12.

The memory cell array MCA may include a plurality of memory cells (e.g., the plurality of memory cells MC shown in FIG. 3), which are respectively at intersections between a plurality of first signal lines and a plurality of second signal lines. In an implementation, the plurality of first signal lines may include a plurality of bit lines, and the plurality of second signal lines may include a plurality of word lines. In an implementation, the plurality of first signal lines may include a plurality of word lines, and the plurality of second signal lines may include a plurality of bit lines.

Each of the plurality of memory cells may include a single-level cell (SLC) capable of storing one bit, a multi-level cell (MLC) capable of storing data of at least two bits or more, or a combination thereof.

Figure 3:
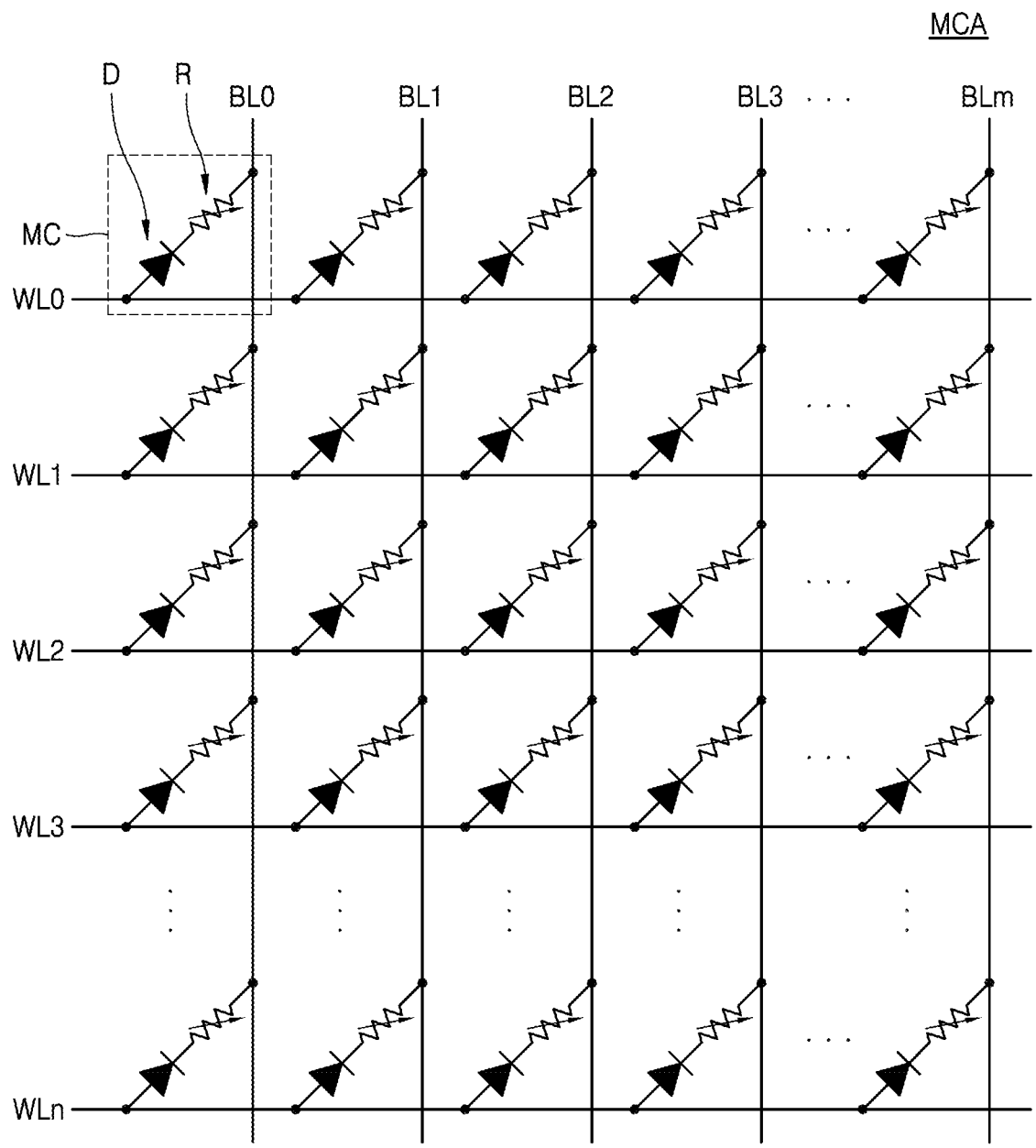
FIG. 3 is a circuit diagram of an embodied example of a memory cell shown in FIG. 2.

The memory cell array MCA may include resistive memory cells, each of which includes a variable resistance element, e.g., a variable resistor R shown in FIG. 3. In an implementation, when the variable resistance element includes a phase-change material of which a resistance varies according to temperature, the memory device 12 may be a phase-change random access memory (PRAM) device.

The row decoder RD may drive the plurality of word lines included in the memory cell array MCA, and the column decoder CD may drive the plurality of bit lines included in the memory cell array MCA. The row decoder RD may include a decoding unit configured to decode a row address and a switch unit configured to be switched on or off in response to various row control signals based on the decoding result. The column decoder CD may include a decoding unit configured to decode a column address and a switching unit configured to be switched on or off in response to various column control signals based on the decoding result.

The control logic CL may control all operations of the memory device 12 and control the row decoder RD and the column decoder CD to perform an operation of selecting a memory cell from the memory cell array MCA. In an implementation, the control logic CL may process an address received from the outside and generate a row address and a column address. The memory device 12 may include a power generating unit configured to generate various write and read voltages used for the write and read operations. The memory device 12 may provide the write voltage and the read voltage through the row decoder RD and the column decoder CD to memory cells via the control of the control logic CL.

Figure 2:
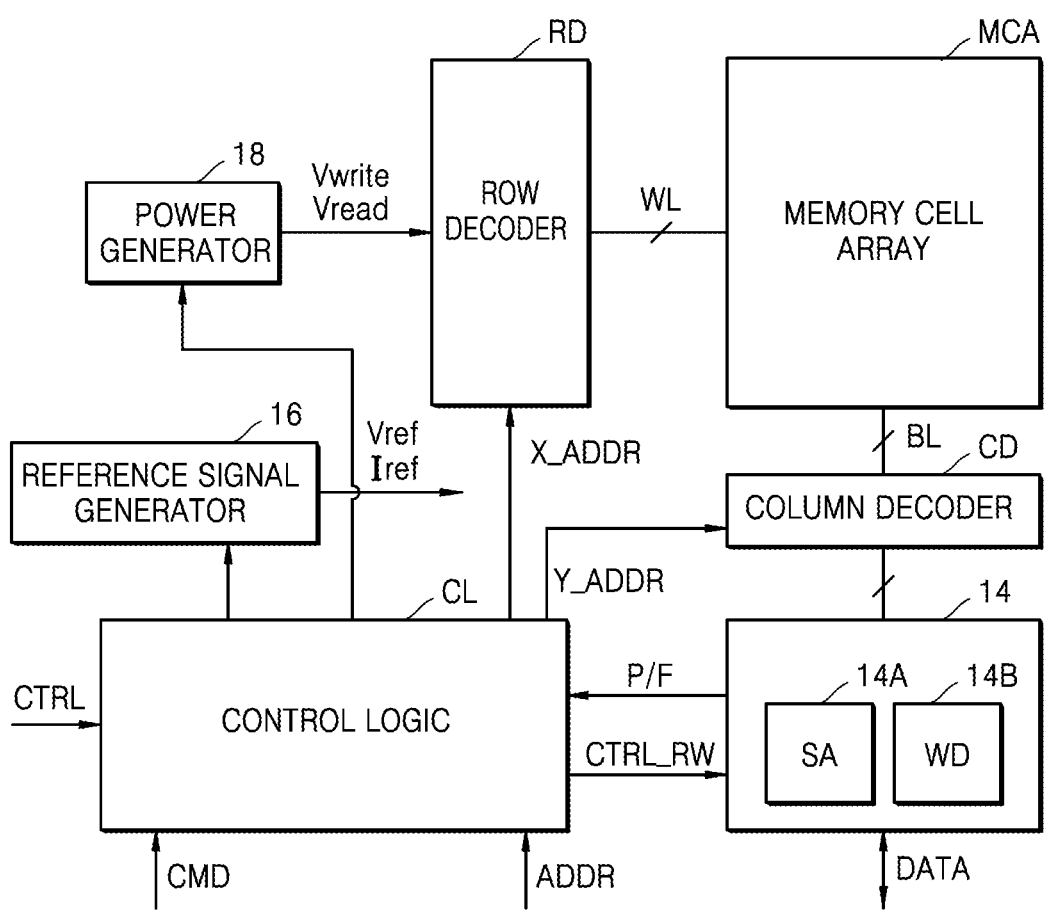
FIG. 2 is a block diagram of an example configuration of the memory device shown in FIG. 1.

FIG. 2 is a block diagram of an example configuration of the memory device 12 shown in FIG. 1.

Referring to FIG. 2, the memory device 12 may include a memory cell array MCA, a row decoder RD, a column decoder CD, and a control logic CL. In addition, the memory device 12 may further include a write/read circuit 14, a reference signal generator 16, and a power generator 18. The write/read circuit 14 may include a sense amplifier 14A and a write driver 14B.

A plurality of memory cells included in the memory cell array MCA may be connected to a plurality of word lines WL and a plurality of bit lines BL. Various voltage signals or current signals may be provided to the plurality of memory cells through the plurality of word lines WL and the plurality of bit lines BL. Thus, data may be written to or read from selected memory cells, while a write operation or a read operation may be prevented from being performed on the remaining unselected memory cells.

The control logic CL may receive an address ADDR for indicating a memory cell to be accessed, along with a command CMD. The address ADDR may include a row address X_ADDR for selecting the word line WL of the memory cell array MCA and a column address Y_ADDR for selecting the bit line BL of the memory cell array MCA. The row decoder RD may perform a word line selection operation in response to the row address X_ADDR, and the column decoder CD may perform a bit line selection operation in response to the column address Y_ADDR.

The write/read circuit 14 may be connected to the bit line BL and write data to a memory cell or read data from the memory cell.

The power generator 18 may generate a write voltage Vwrite used for a write operation and a read voltage Vread used for a read operation. The write voltage Vwrite may include a set voltage and a reset voltage. The write voltage Vwrite and the read voltage Vread may be provided through the column decoder CD to the bit line BL or provided through the row decoder RD to the word line WL.

The reference signal generator 16 may generate a reference voltage Vref and a reference current Iref as various reference signals related to a data read operation.

In the write/read circuit 14, the sense amplifier 14A may be connected to a sensing node of the bit line BL to determine data by using the reference voltage Vref or the reference current Iref. The write/read circuit 14 may provide a pass/fail signal P/F to the control logic CL based on a result of determination of read data. The control logic CL may control write and read operations on the memory cell array MCA with reference to the pass/fail signal P/F.

The control logic CL may output various control signals CTRL_RW for writing data to the memory cell array MCA or reading data from the memory cell array MCA, based on the address ADDR, the command CMD, and the control signal CTRL, which are received from the memory controller (refer to 20 in FIG. 1).

FIG. 3 is a circuit diagram of an embodied example of the memory cell array MCA shown in FIG. 2.

Referring to FIG. 3, the memory cell array MCA may include a plurality of cell regions. FIG. 3 may illustrate one of the plurality of cell regions.

The memory cell array MCA may include a plurality of word lines WL0, WL1, . . . , and WLn, a plurality of bit lines BL0, BL1, . . . , and BLm, and a plurality of memory cells MC.

The plurality of word lines WL0, WL1, . . . , and WLn may correspond to the word line WL of FIG. 2, and the plurality of bit lines BL0, BL1, . . . , and BLm may correspond to the bit line BL of FIG. 2. The plurality of memory cells MC may be respectively at intersections between the plurality of word lines WL0, WL1, . . . , and WLn and the plurality of bit lines BL0, BL1, . . . , and BLm. The number of word lines WL, the number of bit lines BL, and the number of memory cells MC may be variously changed according to an embodiment.

Each of the plurality of memory cells MC may include a variable resistor R configured to store information and a selection element D configured to select a memory cell. The selection element D may be electrically connected to one of the plurality of word lines WL0, WL1, . . . , and WLn, the variable resistor R may be electrically connected to one of the plurality of bit lines BL0, BL1, . . . , and BLm, and the variable resistor R may be connected in series to the selection element D. In an implementation, the variable resistor R may be connected to a word line, and the selection element D may be connected to a bit line.

To drive the memory device (refer to 12 in FIG. 2), a voltage may be applied to the variable resistor R of the memory cell MC through the plurality of word lines WL0, WL1, . . . , and WLn and the plurality of bit lines BL0, BL1, . . . , and BLm, and thus, current may flow through the variable resistor R. The variable resistor R may be changed into one of a plurality of resistance states due to an electric pulse applied thereto. In an implementation, the variable resistor R may include a phase-change material of which a crystal state varies according to the amount of current. The phase-change material may be changed into an amorphous state, which is a relatively high resistance state, or a crystalline state, which is a relatively low resistance state. A phase of the phase-change material may be changed due to Joule's heat generated according to the amount of current, and data may be written using the phase change.

An arbitrary memory cell MC may be addressed by selecting one word line from the plurality of word lines WL0, WL1, . . . , and WLn and selecting one bit line from the plurality of bit lines BL0, BL1, . . . , and BLm. The memory cell MC may be programmed by applying a predetermined signal between the selected word line and the selected bit line. In addition, by measuring a current value using the plurality of bit lines BL0, BL1, . . . , and BLm, information (i.e., programmed information) corresponding to a resistance of a resistive memory pattern of the memory cell MC may be read.

Figure 4:
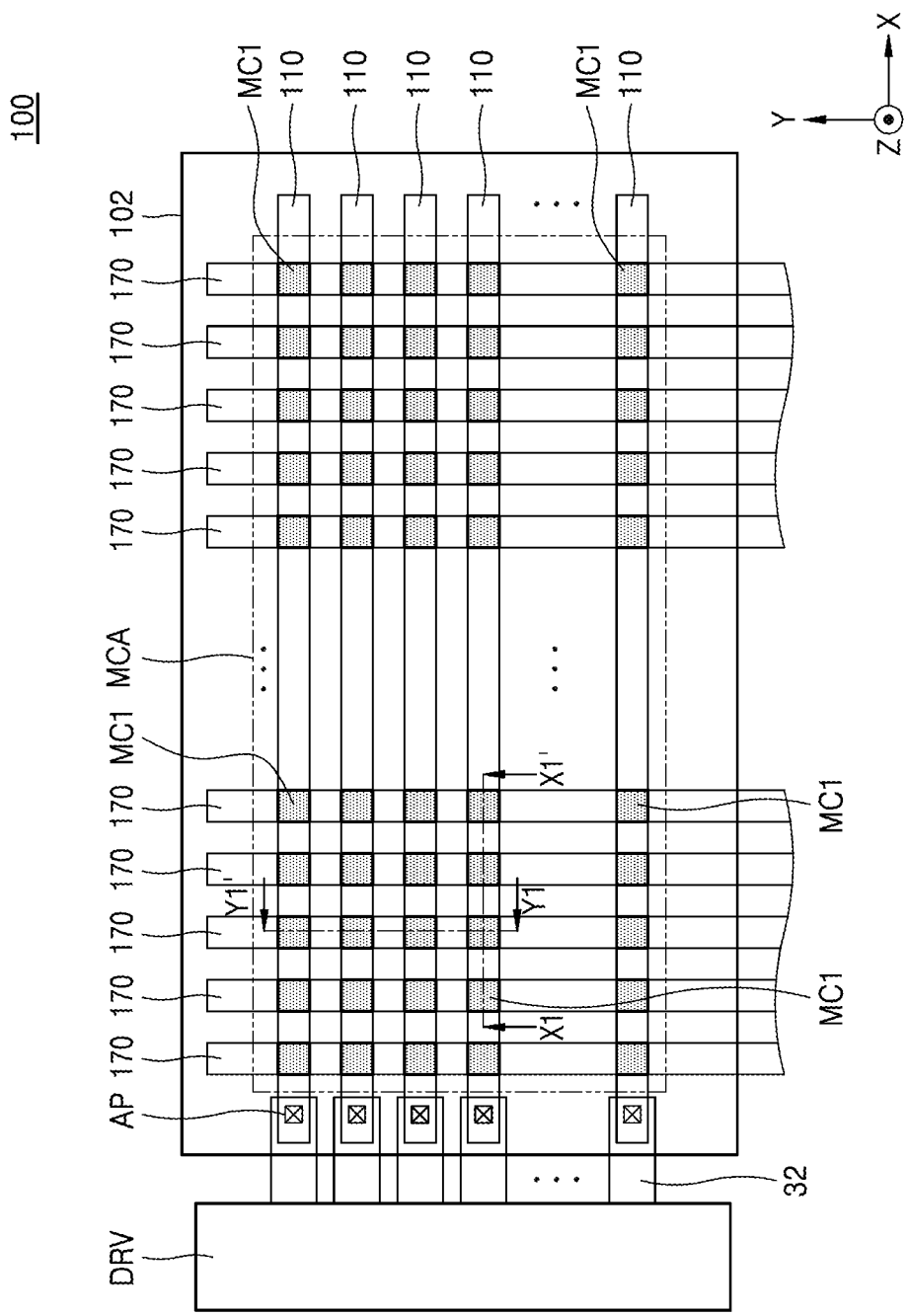
FIG. 4 is a schematic plan layout diagram of some components of a resistive memory device according to embodiments.
Figure 5A:
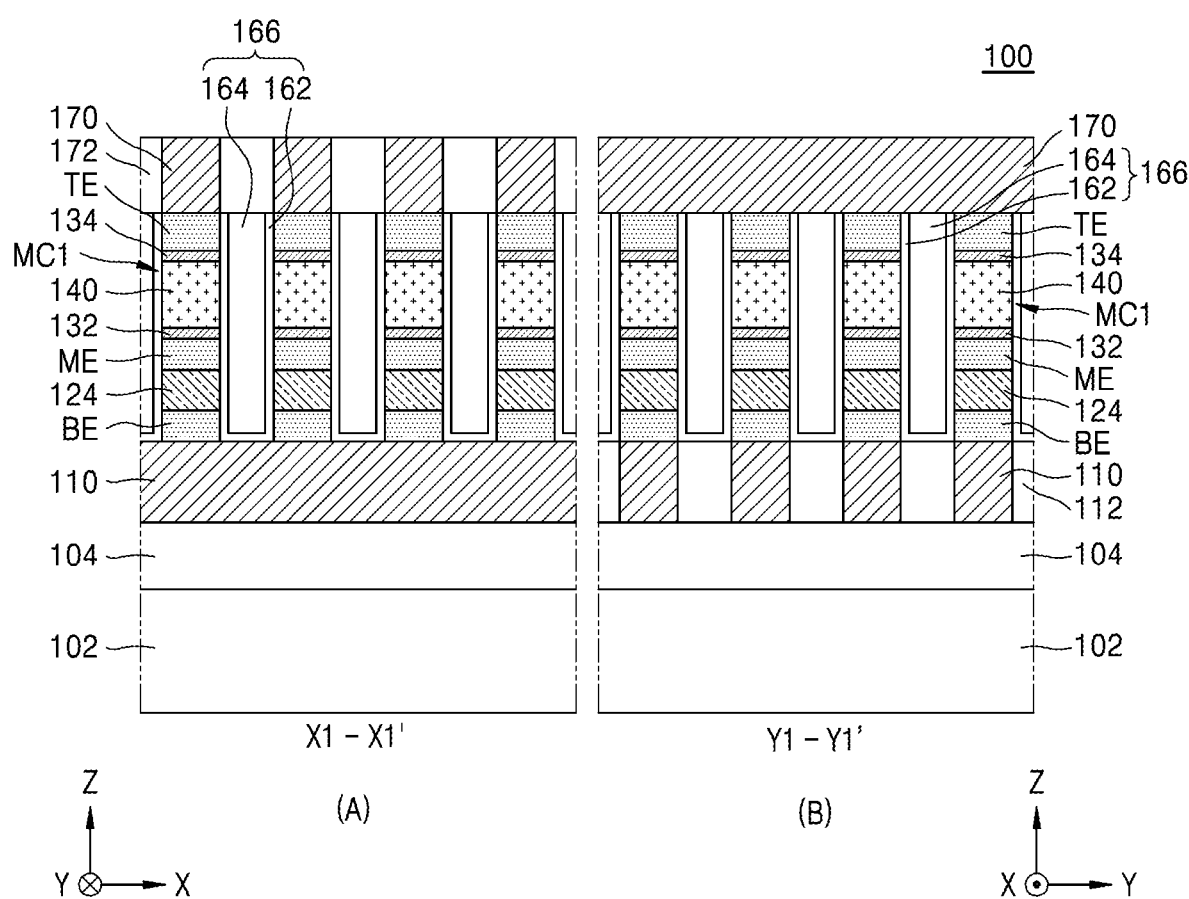
FIG. 5A is cross-sectional views taken along line X1-X1' and line Y1-Y1' of FIG. 4.
Figure 5B:
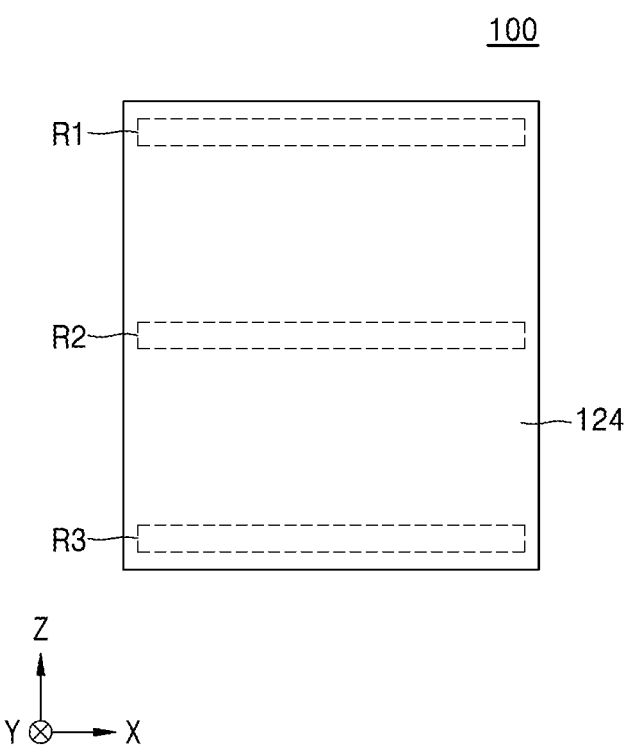
FIG. 5B is a cross-sectional view of a selection element pattern shown in FIG. 5A.

FIGS. 4, 5A, and 5B are diagrams of a resistive memory device 100 according to embodiments. Specifically, FIG. 4 is a schematic plan layout diagram of some components of the resistive memory device 100. In FIG. 5A, part (A) is a cross-sectional view taken along line X1-X1' of FIG. 4, and part (B) is a cross-sectional view taken along line Y1-Y1' of FIG. 4. FIG. 5B is a cross-sectional view of a partial region of a selection element pattern 124 shown in FIG. 5A. The resistive memory device 100 shown in FIGS. 4, 5A, and 5B may have an equivalent circuit configuration described with reference to FIG. 3.

As shown in FIGS. 4 and 5A, the memory cell array MCA of the resistive memory device 100 may include a plurality of first conductive lines 110 and a plurality of second conductive lines 170. The plurality of first conductive lines 110 may extend (e.g., lengthwise) parallel to each other in a first lateral direction (X direction) on a substrate 102. The plurality of second conductive lines 170 may extend (e.g., lengthwise) parallel to each other in a second lateral direction (Y direction). The second lateral direction (Y direction) may intersect with the first lateral direction (X direction). In an implementation, the first lateral direction (X direction) may be perpendicular to the second lateral direction (Y direction). In an implementation, the plurality of first conductive lines 110 may constitute the plurality of word lines WL0, WL1, . . . , and WLn shown in FIG. 3, and the plurality of second conductive lines 170 may constitute the plurality of bit lines BL0, BL1, . . . , and BLm shown in FIG. 3. In an implementation, the plurality of first conductive lines 110 may constitute the plurality of bit lines BL0, BL1, . . . , and BLm, and the plurality of second conductive lines 170 may constitute the plurality of word lines WL0, WL1, . . . , and WLn.

A plurality of memory cells MC1 may be respectively at a plurality of intersections between the plurality of word lines WL0, WL1, . . . , and WLn and the plurality of bit lines BL0, BL1, . . . , and BLm. Each of the plurality of memory cells MC1 may be connected to one of the plurality of word lines WL0, WL1, . . . , and WLn and one of the plurality of bit lines BL0, BL1, . . . , and BLm.

An interlayer insulating film 104 may be on the substrate 102. The interlayer insulating film 104 may include an oxide film, a nitride film, or a combination thereof. The interlayer insulating film 104 may electrically isolate the plurality of first conductive lines 110 from the substrate 102. In an implementation, as illustrated in FIG. 5A, the interlayer insulating film 104 may be on (e.g., directly on) the substrate 102. In an implementation, an integrated circuit (IC) layer may be on the substrate 102, and the plurality of memory cells MC1 may be on the IC layer. The IC layer may include a peripheral circuit for operations of the plurality of memory cells MC1 and/or a core circuit for calculations.

As shown in FIG. 4, the plurality of first conductive lines 110 may be connected to a driver DRV. The driver DRV may be a circuit configured to apply voltages to the plurality of first conductive lines 110 and include, e.g., the row decoder described with reference to FIG. 2. As shown in FIG. 4, the driver DRV may apply a voltage through a wiring 32 to an access point AP of each of the plurality of first conductive lines 110. During a set write operation, a selected memory cell MC1 may receive a voltage through a selected first conductive line 110 and a selected second conductive line 170. In an implementation, a set high voltage may be applied through the selected first conductive line 110 through the access point AP, while a set low voltage, which is lower than the set high voltage, may be applied to the selected second conductive line 170. Thus, a voltage corresponding to a potential difference between the set high voltage and the set low voltage may be applied to both ends of the selected memory cell MC1, and a set current may flow through the selected memory cell MC1. As a result, current may flow through the plurality of first conductive lines 110 and the plurality of second conductive lines 170.

A plurality of first insulating lines 112 may be respectively between the plurality of first conductive lines 110, and a plurality of second insulating lines 172 may be respectively between the plurality of second conductive lines 170. The plurality of first insulating lines 112 and the plurality of second insulating lines 172 may include a silicon oxide film, a silicon nitride film, or a combination thereof.

Each of the plurality of first conductive lines 110 and the plurality of second conductive lines 170 may include a metal, a conductive metal nitride, a conductive metal oxide, or a combination thereof. In an implementation, each of the plurality of first conductive lines 110 and the plurality of second conductive lines 170 may independently include, e.g., tungsten (W), titanium (Ti), tantalum (Ta), aluminum (Al), copper (Cu), carbon (C), carbon nitride (CN), titanium nitride (TiN), titanium aluminum nitride (TiAlN), titanium silicon nitride (TiSiN), titanium carbon nitride (TiCN), titanium carbon silicon nitride (TiCSiN), tungsten nitride (WN), cobalt silicon nitride (CoSiN), tungsten silicon nitride (WSiN), tantalum nitride (TaN), tantalum carbon nitride (TaCN), tantalum silicon nitride (TaSiN), gold (Au), silver (Ag), iridium (Ir), platinum (Pt), palladium (Pd), ruthenium (Ru), zirconium (Zr), rhodium (Rh), nickel (Ni), cobalt (Co), chromium (Cr), tin (Sn), zinc (Zn), indium tin oxide (ITO), an alloy thereof, or a combination thereof. Each of the plurality of first conductive lines 110 and the plurality of second conductive lines 170 may further include a conductive barrier film. The conductive barrier film may include, e.g., Ti, TiN, Ta, TaN, or a combination thereof. In an implementation, the plurality of first conductive lines 110 may include a metal film, and the plurality of second conductive lines 170 may include a multilayered film including a conductive metal nitride film and a metal film. As used herein, the term "or" is not an exclusive term, e.g., "A or B" would include A, B, or A and B.

The plurality of memory cells MC1 arranged at intersections between the plurality of first conductive lines 110 and the plurality of second conductive lines 170 may be insulated from each other by an insulating structure 166. The insulating structure 166 may cover sidewalls of each of the plurality of memory cells MC1 on the plurality of first insulating lines 112. The insulating structure 166 may include an encapsulation liner 162 and a gap-fill insulating film 164. The encapsulation liner 162 may be in contact with the sidewalls of each of the plurality of memory cells MC1. The gap-fill insulating film 164 may be apart from the plurality of memory cells MC1 with the encapsulation liner 162 therebetween and fill respective spaces between the plurality of memory cells MC1 on the encapsulation liner 162.

In an implementation, each of the plurality of first insulating lines 112, the plurality of second insulating lines 172, the encapsulation liner 162, and the gap-fill insulating film 164 may include a silicon oxide film, a silicon nitride film, or a combination thereof. In an implementation, the gap-fill insulating film 164 may include a seam or an air gap. As used herein, the term "air" may refer to the atmosphere or other gases that may be present during a manufacturing process. In an implementation, the first insulating line 112 may include a silicon nitride film, the encapsulation liner 162 may include a silicon oxide film, a silicon nitride film, or a combination thereof, and the gap-fill insulating film 164 may include a silicon oxide film.

Each of the plurality of memory cells MC1 may include a lower electrode BE, the selection element pattern 124, a middle electrode ME, a lower barrier 132, a resistive memory pattern 140, an upper barrier 134, and an upper electrode TE, which are sequentially stacked on the first conductive line 110.

In an implementation, in the plurality of memory cells MC1, each of the lower electrode BE, the middle electrode ME, and the upper electrode TE may include a conductive material, e.g., W, Ti, Ta, Al, Cu, C, CN, TiN, TiAlN, TiSiN, TiCN, TiCSiN, WN, CoSiN, WSiN, TaN, TaCN, TaSiN, or a combination thereof.

In the plurality of memory cells MC1, the selection element pattern 124 may be electrically connected to the resistive memory pattern 140. The selection element pattern 124 may include a material layer of which a resistance is variable according to the magnitude of a voltage applied to ends, e.g., both ends, of the selection element pattern 124. The selection element pattern 124 may include a chalcogenide switching material, which is in an amorphous state. In an implementation, the selection element pattern 124 may include an ovonic threshold switching (OTS) material.

In an implementation, the selection element pattern 124 may include a chalcogenide switching material including germanium (Ge), arsenic (As), and selenium (Se), and a metallic material including, e.g., aluminum (Al), strontium (Sr), or indium (In). The selection element pattern 124 may include an inhomogeneous material layer in which content of the at least one metallic material is variable according to a position of or within the selection element pattern 124. In an implementation, as shown in FIG. 5B, the at least one metallic material may be included at different contents or amounts in at least two of different regions R1, R2, and R3 in a vertical direction (Z direction) in the selection element pattern 124.

In an implementation, the selection element pattern 124 may be represented by Formula 1.

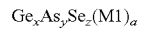  [Formula 1]

In Formula 1, M1 may be, e.g., Al or Sr, and $0.13 \leq x \leq 0.23$, $0.25 \leq y \leq 0.35$, $0.38 \leq z \leq 0.50$, $0.001 \leq a \leq 0.06$, and $x+y+z+a=1$.

In an implementation, the selection element pattern 124 may include a compound represented by $Ge_xAs_ySe_zAl_a$. In an implementation, the selection element pattern 124 may include a compound represented by $Ge_xAs_ySe_zSr_a$. Here, a range of each of x, y, z, and a may be the same as defined for Formula 1.

In an implementation, the selection element pattern 124 may be represented by Formula 2.

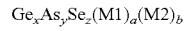  [Formula 2]

In Formula 2, M1 may be, e.g., Al or Sr, M2 may be, e.g., In, and $0.13 \leq x \leq 0.23$, $0.25 \leq y \leq 0.35$, $0.38 \leq z \leq 0.50$, $0.001 \leq a \leq 0.08$, $0.001 \leq b \leq 0.06$, and $x+y+z+a+b=1$.

In an implementation, the selection element pattern 124 may include a compound represented by $Ge_xAs_ySe_zAl_aIn_b$. In an implementation, the selection element pattern 124 may include a compound represented by $Ge_xAs_ySe_zSr_aIn_b$. Here, a range of each of x, y, z, a, and b may be the same as defined for Formula 2.

In an implementation, the selection element pattern 124 may further include a same metal element as a metal element included in the plurality of first conductive lines 110. In an implementation, the selection element pattern 124 may further include, e.g., tungsten (W), titanium (Ti), or copper (Cu). In an implementation, a content of the additional metal element in the selection element pattern 124 may be, e.g., more than 0 atomic percent (at %) and less than 2 at %.

In an implementation, the selection element pattern 124 may include a first compound represented by $Ge_xAs_ySe_zAl_a(M3)_c$, a second compound represented by $Ge_xAs_ySe_zSr_a(M3)_c$, a third compound represented by $Ge_xAs_ySe_zAl_aIn_b(M3)_c$, or a fourth compound represented by $Ge_xAs_ySe_zSr_aIn_b(M3)_c$. In an implementation, M3 may include, e.g., W, Ti, or Cu. In the first and second compounds, $x+y+z+a+c=1$, a range of each of x, y, z, and a may be the same as defined for Formula 1, and $0<c\leq0.02$. In the third and fourth compounds, $x+y+z+a+b+c=1$, a range of each of x, y, z, a, and b may be the same as defined for Formula 2, and $0<c\leq0.02$.

In an implementation, the selection element pattern 124 may further include, e.g., aluminum oxide or strontium oxide.

In an implementation, the selection element pattern 124 may further include at least one additional element, e.g., boron (B), carbon (C), nitrogen (N), or oxygen (O).

Referring to FIG. 5A, the resistive memory pattern 140 may include a phase-change material, which is reversibly switched between an amorphous state and a crystalline state according to heating time. In an implementation, the resistive memory pattern 140 may be reversibly changed in phase by Joule's heat generated due to a voltage applied to both ends of the resistive memory pattern 140, and may include a material of which a resistance may be changed due to the phase change. In an implementation, the resistive memory pattern 140 may include a chalcogenide material as the phase-change material. The resistive memory pattern 140 may include a chalcogenide material having a different composition from the chalcogenide switching material included in the selection element pattern 124.

In an implementation, the resistive memory pattern 140 may include a single layer or multilayered film including, e.g., a binary material (e.g., GeTe, GeSe, GeS, SbSe, SbTe, SbS, SbSe, SnSb, InSb, InSb, AsTe, AlTe, GaSb, AlSb, BiSb, ScSb, Ysb, CeSb, DySb, or NdSb), a ternary material (e.g., GeSbSe, AlSbTe, AlSbSe, SiSbSe, SiSbTe, GeSeTe, InGeTe, GeSbTe, GeAsTe, SnSeTe, GeGaSe, BiSbSe, GaSeTe, InGeSb, GaSbSe, GaSbTe, InSbSe, InSbTe, SnSbSe, SnSbTe, ScSbTe, ScSbSe, ScSbS, YSbTe, YSbSe, YSbS, CeSbTe, CeSbSe, CeSbS, DySbTe, DySbSe, DySbS, NdSbTe, NdSbSe, or NdSbS), a quaternary material (e.g., GeSbTeS, BiSbTeSe, AgInSbTe, GeSbSeTe, GeSnSbTe, SiGeSbTe, SiGeSbSe, SiGeSeTe, BiGeSeTe, BiSiGeSe, BiSiGeTe, GeSbTeBi, GeSbSeBi, GeSbSeIn, GeSbSeGa, GeSbSeAl, GeSbSeTl, GeSbSeSn, GeSbSeZn, GeSbTeIn, GeSbTeGa, GeSbTeAl, GeSbTeTl, GeSbTeSn, GeSbTeZn, ScGeSbTe, ScGeSbSe, ScGeSbS, YGeSbTe, YGeSbSe, YGeSbS, CeGeSbTe, CeGeSbSe, CeGeSbS, DyGeSbTe, DyGeSbSe, DyGeSbS, NdGeSbTe, NdGeSbSe, or NdGeSbS), or a quinary material (e.g., InSbTeAsSe, GeScSbSeTe, GeSbSeTeS, GeScSbSeS, GeScSbTeS, GeScSeTeS, GeScSbSeP, GeScSbTeP, GeSbSeTeP, GeScSbSeIn, GeScSbSeGa, GeScSbSeAl, GeScSbSeTl, GeScSbSeZn, GeScSbSeSn, GeScSbTeIn, GeScSbTeGa, GeSbAsTeAl, GeScSbTeTl, GeScSbTeZn, GeScSbTeSn, GeSbSeTeSn, GeSbSeTeGa, GeSbSeTeAl, GeSbSeTeTl, GeSbSeTeZn, GeSbSeTeSn, GeSbSeSIn, GeSbSeSGa, GeSbSeSAl, GeSbSeSTl, GeSbSeSZn, GeSbSeSSn, GeSbTeSIn, GeSbTeSGa, GeSbTeSAl, GeSbTeSTl, GeSbTeSZn, GeSbTeSSn, GeSbSeInGa, GeSbSeInAl, GeSbSeInTl, GeSbSeInZn, GeSbSeInSn, GeSbSeGaAl, GeSbSeGaTl, GeSbSeGaZn, GeSbSeGaSn, GeSbSeAlTl, GeSbSeAlZn, GeSbSeAlSn, GeSbSeTlZn, GeSbSeTlSn, or GeSbSeZnSn).

In an implementation, the resistive memory pattern 140 may include one of the binary to quinary materials described above as constituent materials of the resistive memory pattern 140, and may further at least one additional element, e.g., boron (B), carbon (C), nitrogen (N), oxygen (O), phosphorous (P), cadmium (Cd), tungsten (W), titanium (Ti), hafnium (Hf), or zirconium (Zr).

As shown in FIG. 5A, a bottom surface of the resistive memory pattern 140 may be in contact (e.g., direct contact) with the lower barrier 132, and a top surface of the resistive memory pattern 140 may be in contact (e.g., direct contact) with the upper barrier 134. In an implementation, each of the lower barrier 132 and the upper barrier 134 may include a conductive material, e.g., tungsten (W), tungsten nitride (WN), tungsten carbide (WC), or a combination thereof.

In the resistive memory device 100, the selection element pattern 124 may be connected to one of the plurality of first conductive lines 110 through the lower electrode BE, and the resistive memory pattern 140 may be connected to one of the plurality of second conductive lines 170 through the upper barrier 134 and the upper electrode TE.

In an implementation, as illustrated in FIG. 5A, sidewalls of each of the lower electrode BE, the selection element pattern 124, the middle electrode ME, the lower barrier 132, the resistive memory pattern 140, the upper barrier 134, and the upper electrode TE may extend in or be aligned along the vertical direction (Z direction). In an implementation, the sidewalls of each of the lower electrode BE, the selection element pattern 124, the middle electrode ME, the lower barrier 132, the resistive memory pattern 140, the upper barrier 134, and the upper electrode TE may have tapered sidewalls.

In the resistive memory device 100 described with reference to FIGS. 4, 5A, and 5B, the selection element pattern 124 of each of the plurality of memory cells MC1 may include a chalcogenide switching material including Ge, As, and Se, and at least one metallic material, e.g., Al, Sr, or In, and may include an inhomogeneous material layer in which a content of the at least one material in the selection element pattern 124 is variable according to a position of or within the selection element pattern 124.

According to the resistive memory device 100 having the above-described configuration, the selection element pattern 124 may include Al, Sr, or In. Thus, in each of the plurality of memory cells MC1, a leakage current Ioff may be reduced, and a variation in threshold voltage Vth may be reduced. Here, the variation in the threshold voltage Vth may refer to a variation in threshold voltage Vth with respect to operation time of each of the plurality of memory cells MC1. In an implementation, a compound included in the selection element pattern 124 may include Al, Sn, or In, and a crystallization temperature and a volatilization temperature of the compound included in the selection element pattern 124 may be relatively elevated. Accordingly, when external heat is applied to the selection element pattern 124, the thermal stability of the selection element pattern 124 may be improved. As a result, the resistive memory device 100 may enable write and read operations with improved reliability, and the lifespan of the resistive memory device 100 may be increased.

FIGS. 6A to 6G are respectively cross-sectional views of resistive memory devices 200A, 200B, 200C, 200D, 200E, 200F, and 200G according to embodiments.

Figure 6A:
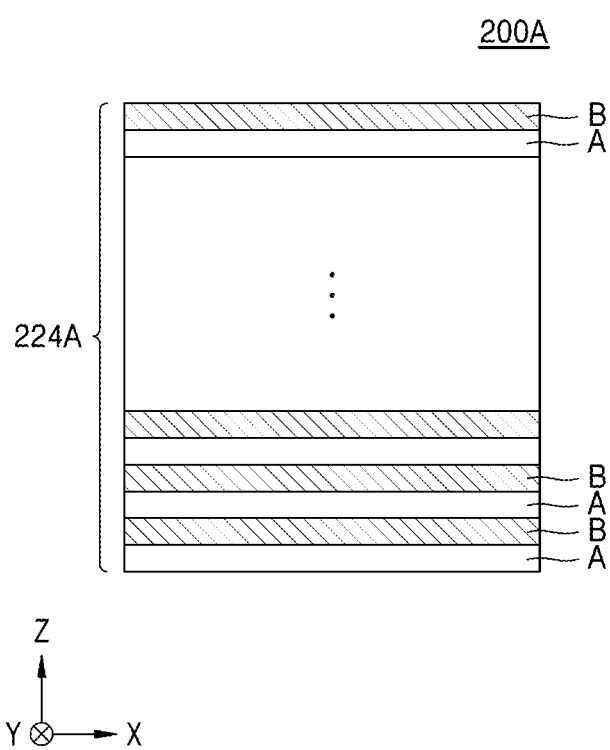
FIGS. 6A to 6G are respectively cross-sectional views of resistive memory devices according to embodiments.

Referring to FIG. 6A, the resistive memory device 200A may have substantially the same configuration as the resistive memory device 100 described with reference to FIGS. 4, 5A, and 5B. However, in the resistive memory device 200A, each of a plurality of memory cells MC1 may include a selection element pattern 224A instead of the selection element pattern 124.

The selection element pattern 224A may include a plurality of chalcogenide layers having different compositions. The plurality of chalcogenide layers may include a plurality of first chalcogenide layers A and a plurality of second chalcogenide layers B, which are alternately stacked one by one. The plurality of first chalcogenide layers A and the plurality of second chalcogenide layers B may be respectively at different shortest distances (e.g., Z-directional distances or heights) from the resistive memory pattern (refer to 140 in FIG. 5A).

In an implementation, the first chalcogenide layer A may include, e.g., Ge, As, and Se, and may not include Al and may not include Sr. In an implementation, the first chalcogenide layer A may include, e.g., a ternary material (e.g., GeAsSe), a quaternary material (e.g., GeAsSeIn, GeAsSeW, GeAsSeTi, or GeAsSeCu), or a quinary material (e.g., GeAsSeInW, GeAsSeInTi, or GeAsSeInCu).

The second chalcogenide layer B may have the same configuration as the selection element pattern 124 described with reference to FIGS. 4, 5A, and 5B. In an implementation, the second chalcogenide layer B may include at least one metallic material, e.g., Al or Sr. In an implementation, the second chalcogenide layer B may include a quaternary material (e.g., GeAsSeAl or GeAsSeSr), a quinary material (e.g., GeAsSeAlIn, GeAsSeSrIn, GeAsSeAlW, GeAsSeAlTi, GeAsSeAlCu, GeAsSeSrW, GeAsSeSrTi, or GeAsSeSrCu), or a senary material (e.g., GeAsSeAlInW, GeAsSeAlInTi, GeAsSeAlInCu, GeAsSeSrInW, GeAsSeSrInTi, or GeAsSeSrInCu).

In an implementation, a thickness (e.g., in the Z direction) of the first chalcogenide layer A may be equal to or different from a thickness of the second chalcogenide layer B. In an implementation, each of the first chalcogenide layer A and the second chalcogenide layer B may have a thickness of about 1 nm to about 10 nm.

In an implementation, the selection element pattern 224A may include at least two stacked pairs of the first chalcogenide layer A and the second chalcogenide layer B. In an implementation, the number of stacked pairs of the first chalcogenide layer A and the second chalcogenide layer B included in the selection element pattern 224A may be about 2 to about 10.

From among the plurality of first chalcogenide layers A included in the selection element pattern 224A, the first chalcogenide layer A at a lowermost side may be in contact (e.g., direct contact) with a lower electrode (refer to BE in FIG. 5A). From the plurality of second chalcogenide layers B included in the selection element pattern 224A, the second chalcogenide layer B at an uppermost side may be in contact (e.g., direct contact) with a middle electrode (refer to ME in FIG. 5A).

Figure 6B:
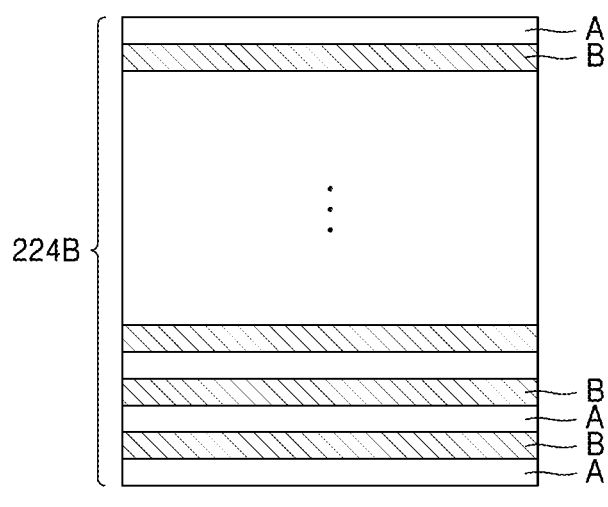
Figure 6B:
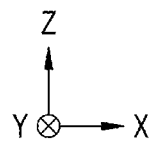

Referring to FIG. 6B, the resistive memory device 200B may have substantially the same configuration as the resistive memory device 100 described with reference to FIGS. 4, 5A, and 5B. However, in the resistive memory device 200B, each of the plurality of memory cells MC1 may include a selection element pattern 224B instead of the selection element pattern 124.

Similar to the selection element pattern 224A described with reference to FIG. 6A, the selection element pattern 224B may include a plurality of first chalcogenide layers A and a plurality of second chalcogenide layers B, which have different compositions. However, from among the plurality of first chalcogenide layers A included in the selection element pattern 224B, the first chalcogenide layer A at a lowermost side may be in contact with a lower electrode (refer to BE in FIG. 5A), and the first chalcogenide layer A at an uppermost side may be in contact with a middle electrode (refer to ME in FIG. 5A). Each of the plurality of second chalcogenide layers B included in the selection element pattern 224B may be spaced apart from the lower electrode BE and the middle electrode ME in a vertical direction (Z direction).

Figure 6C:
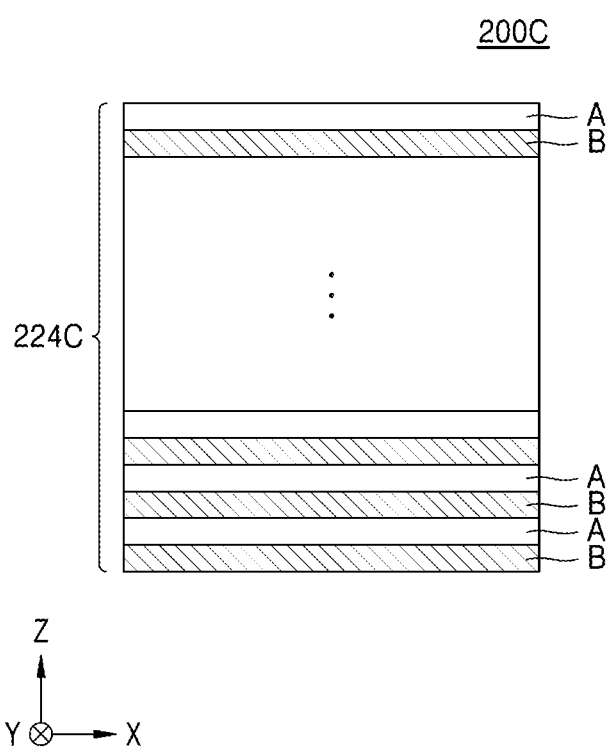

Referring to FIG. 6C, the resistive memory device 200C may have substantially the same configuration as the resistive memory device 100 described with reference to FIGS. 4, 5A, and 5B. However, in the resistive memory device 200C, each of the plurality of memory cells MC1 may include a selection element pattern 224C instead of the selection element pattern 124.

Similar to the selection element pattern 224A described with reference to FIG. 6A, the selection element pattern 224C may include a plurality of first chalcogenide layers A and a plurality of second chalcogenide layers B, which have different compositions. However, the second chalcogenide layer B at a lowermost side, from among the plurality of second chalcogenide layers B included in the selection element pattern 224C, may be in contact with a lower electrode (refer to BE in FIG. 5A), and the first chalcogenide layer A at an uppermost side, from among the plurality of first chalcogenide layers A, may be in contact with a middle electrode (refer to ME in FIG. 5A).

Figure 6D:
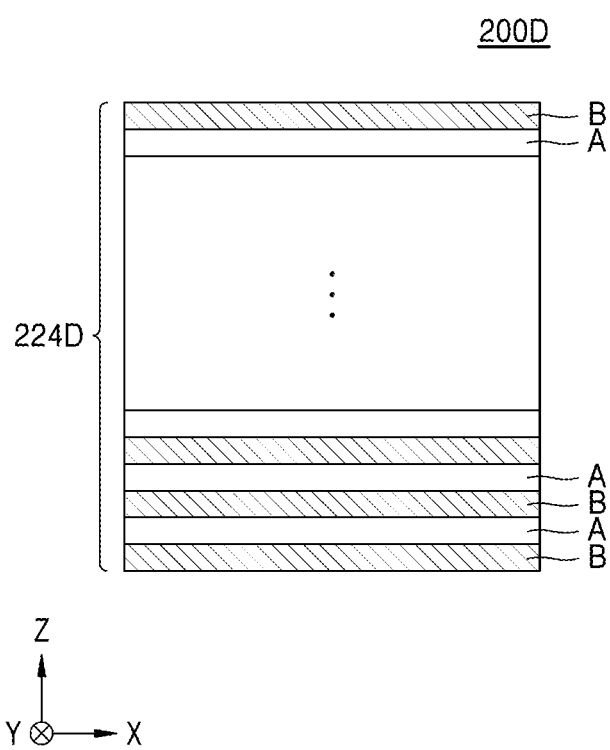

Referring to FIG. 6D, the resistive memory device 200D may have substantially the same configuration as the resistive memory device 100 described with reference to FIGS. 4, 5A, and 5B. However, in the resistive memory device 200D, each of the plurality of memory cells MC1 may include a selection element pattern 224D instead of the selection element pattern 124.

Similar to the selection element pattern 224A described with reference to FIG. 6A, the selection element pattern 224D may include a plurality of first chalcogenide layers A and a plurality of second chalcogenide layers B, which have different compositions. However, the second chalcogenide layer B at a lowermost side, from among the plurality of second chalcogenide layers B included in the selection element pattern 224D, may be in contact with a lower electrode (refer to BE in FIG. 5A), and the second chalcogenide layer B at an uppermost side may be in contact with a middle electrode (refer to ME in FIG. 5A). Each of the plurality of first chalcogenide layers A included in the selection element pattern 224D may be apart from the lower electrode BE and the middle electrode ME in the vertical direction (Z direction).

Figure 6E:
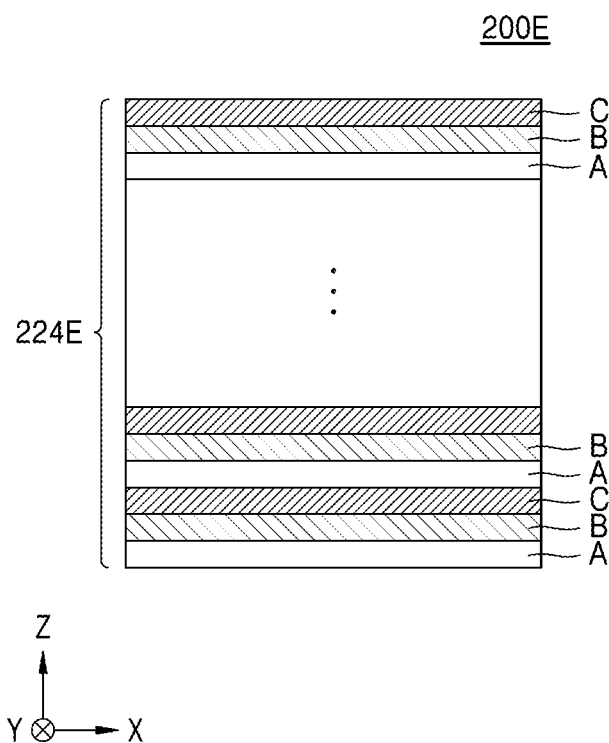

Referring to FIG. 6E, the resistive memory device 200E may have substantially the same configuration as the resistive memory device 100 described with reference to FIGS. 4, 5A, and 5B. However, in the resistive memory device 200E, each of the plurality of memory cells MC1 may include a selection element pattern 224E instead of the selection element pattern 124.

The selection element pattern 224E may include a plurality of chalcogenide layers having different compositions. The plurality of chalcogenide layers may include a plurality of first chalcogenide layers A, a plurality of second chalcogenide layers B, and a plurality of third chalcogenide layers C, which are sequentially stacked one by one. The plurality of first chalcogenide layers A, the plurality of second chalcogenide layers B, and the plurality of third chalcogenide layers C may be respectively at different shortest distances (e.g., Z-directional distances) from the resistive memory pattern (refer to 140 in FIG. 5A).

The plurality of first chalcogenide layers A and the plurality of second chalcogenide layers B may have compositions described with reference to FIG. 6A. Each of the plurality of third chalcogenide layers C may include a compound having the same formula as the second chalcogenide layer B. In an implementation, a content of Al or Sr in the plurality of third chalcogenide layers C may be different from that in the second chalcogenide layer B.

In an implementation, the second chalcogenide layer B and the third chalcogenide layer C may include a compound having the same formula, e.g., GeAsSeAl, GeAsSeAlIn, GeAsSeAlW, GeAsSeAlTi, GeAsSeAlCu, GeAsSeAlInW, GeAsSeAlInTi, or GeAsSeAlInCu. In an implementation, a content of Al in the third chalcogenide layer C may be lower than that of Al in the second chalcogenide layer B.

In an implementation, the second chalcogenide layer B and the third chalcogenide layer C may include a compound having the same formula, e.g., GeAsSeSr, GeAsSeSrIn, GeAsSeSrW, GeAsSeSrTi, GeAsSeSrCu, GeAsSeSrInW, GeAsSeSrInTi, or GeAsSeSrInCu. In an implementation, a content of Sr in the third chalcogenide layer C may be lower than that of Sr in the second chalcogenide layer B.

In an implementation, the first chalcogenide layer A, the second chalcogenide layer B, and the third chalcogenide layer C may have the same thickness or different thicknesses. In an implementation, each of the first chalcogenide layer A, the second chalcogenide layer B, and the third chalcogenide layer C may have a thickness of about 1 nm to about 10 nm.

From among the plurality of first chalcogenide layers A included in the selection element pattern 224E, the first chalcogenide layer A at a lowermost side may be in contact with a lower electrode (refer to BE in FIG. 5A). From among the plurality of third chalcogenide layers C included in the selection element pattern 224E, the third chalcogenide layer C at an uppermost side may be in contact with a middle electrode (refer to ME in FIG. 5A).

Figure 6F:
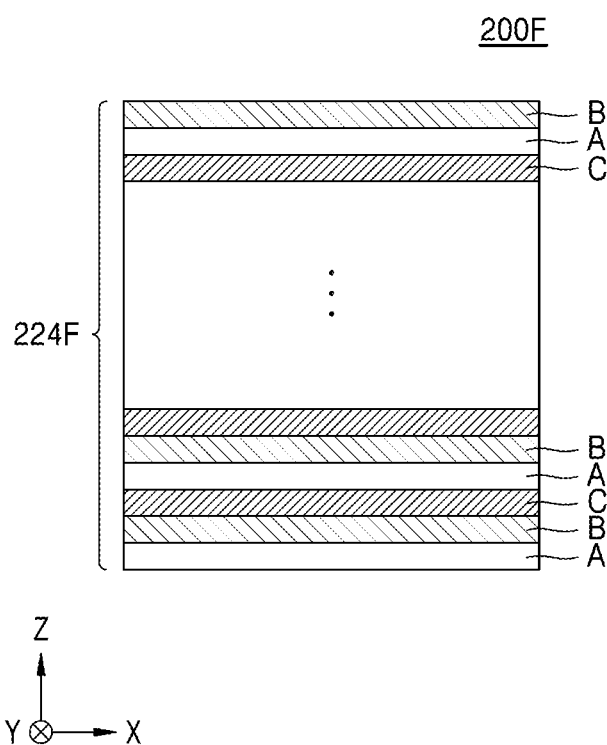

Referring to FIG. 6F, the resistive memory device 200F may have substantially the same configuration as the resistive memory device 100 described with reference to FIGS. 4, 5A, and 5B. However, in the resistive memory device 200F, each of the plurality of memory cells MC1 may include a selection element pattern 224F instead of the selection element pattern 124.

Similar to the selection element pattern 224E described with reference to FIG. 6E, the selection element pattern 224F may include a plurality of first chalcogenide layers A, a plurality of second chalcogenide layers B, and a plurality of third chalcogenide layers C, which have different compositions. However, the first chalcogenide layer A at a lowermost side, from among the plurality of first chalcogenide layers A included in the selection element pattern 224F, may be in contact with a lower electrode (refer to BE in FIG. 5A), and the second chalcogenide layer B at an uppermost side, from among the plurality of second chalcogenide layers B included in the selection element pattern 224F, may be in contact with a middle electrode (refer to ME in FIG. 5A). Each of the plurality of third chalcogenide layers C included in the selection element pattern 224F may be apart from the lower electrode BE and the middle electrode ME in a vertical direction (Z direction).

Figure 6G:
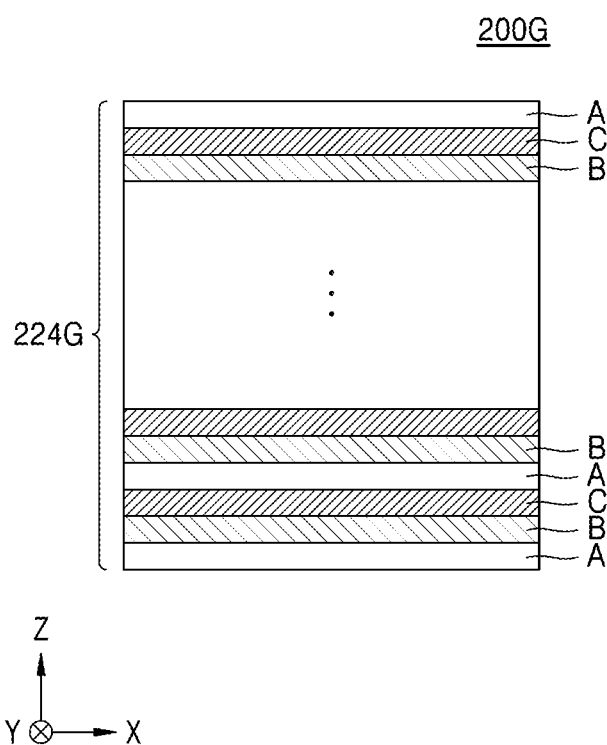

Referring to FIG. 6G, the resistive memory device 200G may have substantially the same configuration as the resistive memory device 100 described with reference to FIGS. 4, 5A, and 5B. However, in the resistive memory device 200G, each of the plurality of memory cells MC1 may include a selection element pattern 224G instead of the selection element pattern 124.

Similar to the selection element pattern 224E described with reference to FIG. 6E, the selection element pattern 224G may include a plurality of first chalcogenide layers A, a plurality of second chalcogenide layers B, and a plurality of third chalcogenide layers C, which have different compositions. However, from among the plurality of first chalcogenide layers A included in the selection element pattern 224G, the first chalcogenide layer A at a lowermost side may be in contact with a lower electrode (refer to BE in FIG. 5A), and the first chalcogenide layer A at an uppermost side may be in contact with a middle electrode (refer to ME in FIG. 5A). The plurality of second chalcogenide layers B and the plurality of third chalcogenide layers C, which are included in the selection element pattern 224G, may be respectively apart from the lower electrode BE and the middle electrode ME in a vertical direction (Z direction).

Specific examples of various structures of the selection element patterns 224A to 224G included in the resistive memory devices 200A to 200G according to the embodiments have been described in detail with reference to FIGS. 6A to 6G. In an implementation, each of a plurality of memory cells included in a resistive memory device according to embodiments may include a selection element pattern having a structure obtained by applying various modifications and changes to the selection element patterns 224A to 224G shown in FIGS. 6A to 6G.

Figure 7:
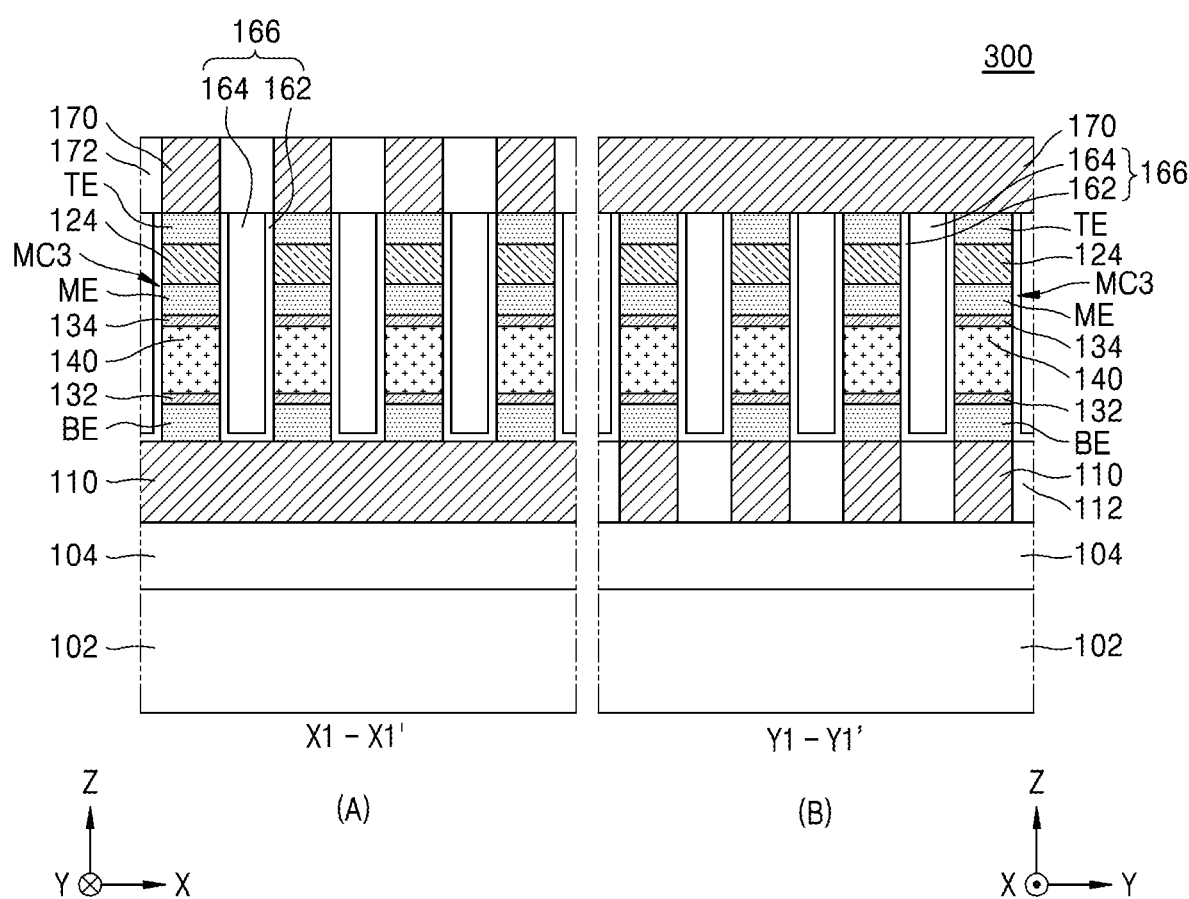
FIG. 7 is a cross-sectional view of a resistive memory device according to an embodiment.

FIG. 7 is a cross-sectional view of a resistive memory device 300 according to embodiments. In FIG. 7, the same reference numerals are used to denote the same elements as in FIG. 5A, and repeated descriptions thereof may be omitted. In FIG. 7, part (A) illustrates some components of a portion corresponding to a cross-section taken along line X1-X1' of FIG. 4, and part (B) illustrates some components of a portion corresponding to a cross-section taken along line Y1-Y1' of FIG. 4.

Referring to FIG. 7, the resistive memory device 300 may have substantially the same configuration as the resistive memory device 100 described with reference to FIGS. 4, 5A, and 5B. However, the resistive memory device 300 may include a plurality of memory cells MC3 instead of the plurality of memory cells MC1.

The plurality of memory cells MC3 may have substantially the same configuration as the plurality of memory cells MC1 described with reference to FIGS. 4, 5A, and 5B. However, each of the plurality of memory cells MC3 may include a lower electrode BE, a lower barrier 132, a resistive memory pattern 140, an upper barrier 134, a middle electrode ME, a selection element pattern 124, and an upper electrode TE, which are sequentially stacked on a first conductive line 110.

In the resistive memory device 300, the resistive memory pattern 140 may be connected to one of a plurality of first conductive lines 110 through the lower barrier 132 and the lower electrode BE, and the selection element pattern 124 may be connected to one of a plurality of second conductive lines 170 through the upper electrode TE.

Figure 8:
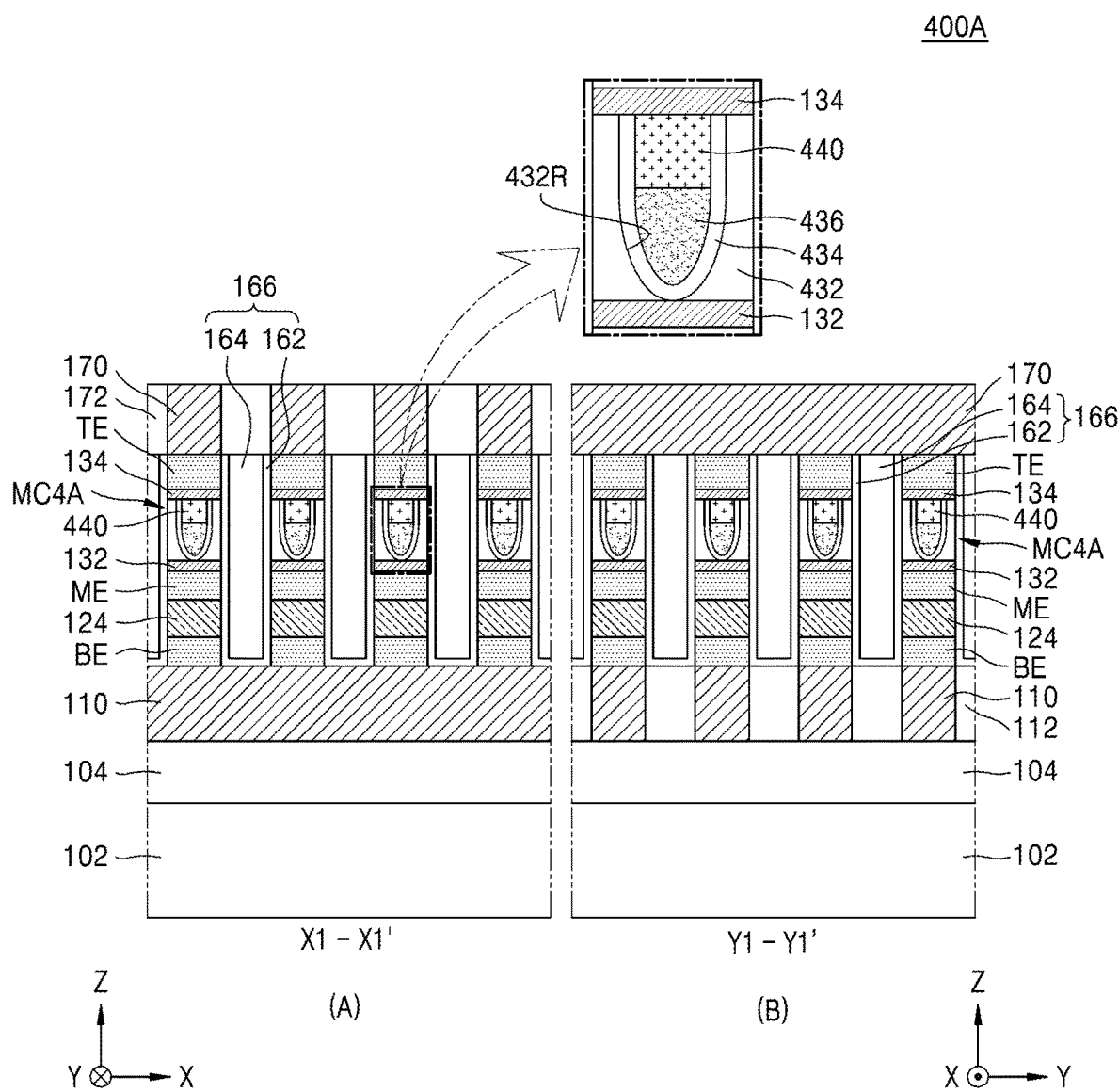
FIG. 8 is a cross-sectional view of a resistive memory device according to an embodiment.

FIG. 8 is a cross-sectional view of a resistive memory device 400A according to embodiments. In FIG. 8, the same reference numerals are used to denote the same elements as in FIG. 5A, and repeated descriptions thereof may be omitted. In FIG. 8, part (A) illustrates some components of a portion corresponding to the cross-section taken along line X1-X1' of FIG. 4, and part (B) illustrates some components of a portion corresponding to the cross-section taken along line Y1-Y1' of FIG. 4.

Referring to FIG. 8, the resistive memory device 400A may have substantially the same configuration as the resistive memory device 100 described with reference to FIGS. 4, 5A, and 5B. However, the resistive memory device 400A may include a plurality of memory cells MC4A instead of the plurality of memory cells MC1.

Each of the plurality of memory cells MC4A may have substantially the same configuration as the memory cell MC1 described with reference to FIGS. 4, 5A, and 5B. However, each of the plurality of memory cells MC4A may include a resistive memory pattern 440 instead of the resistive memory pattern 140. In each of the plurality of memory cells MC4A, an insulating spacer 432 defining a recess 432R, a barrier layer 434 conformally covering an inner wall of the recess 432R, a lower conductive pattern 436 filling a lower space of the recess 432R and on the barrier layer 434, and the resistive memory pattern 440 filling an upper space of the recess 432R and on the lower conductive pattern 436 and the barrier layer 434 may be between a lower barrier 132 and an upper barrier 134. The recess 432R may have an approximately U-shaped sectional shape. The insulating spacers 432 may include a silicon oxide film. In an implementation, the barrier layer 434 may include, e.g., titanium nitride (TiN), titanium silicon nitride (TiSiN), titanium aluminum nitride (TiAlN), tantalum silicon nitride (TaSiN), tantalum aluminum nitride (TaAlN), tantalum nitride (TaN), tungsten silicide (WSi), tungsten nitride (WN), titanium tungsten (TiW), molybdenum nitride (MoN), niobium nitride (NbN), titanium boron nitride (TiBN), zirconium silicon nitride (ZrSiN), tungsten silicon nitride (WSiN), tungsten boron nitride (WBN), zirconium aluminum nitride (ZrAlN), molybdenum aluminum nitride (MoAlN), titanium aluminide (TiAl), titanium oxynitride (TiON), titanium aluminum oxynitride (TiAlON), tungsten oxynitride (WON), tantalum oxynitride (TaON), carbon (C), silicon carbide (SiC), silicon nitride (SiN), silicon carbonitride (SiCN), carbon nitride (CN), titanium carbonitride (TiCN), tantalum carbonitride (TaCN), or a combination thereof. In an implementation, the barrier layer 434 may be omitted. The lower conductive pattern 436 may include a conductive metal nitride, e.g., TiN, WN, or a combination thereof. A constituent material of the resistive memory pattern 440 may be substantially the same as in the resistive memory pattern 140 described with reference to FIGS. 4, 5A, and 5B.

In the resistive memory device 400A, the selection element pattern 124 may be connected to one of a plurality of first conductive lines 110 through a lower electrode BE, and each of a plurality of resistive memory patterns 440 may be connected to one of a plurality of second conductive lines 170 through the upper barrier 134 and an upper electrode TE.

Figure 9:
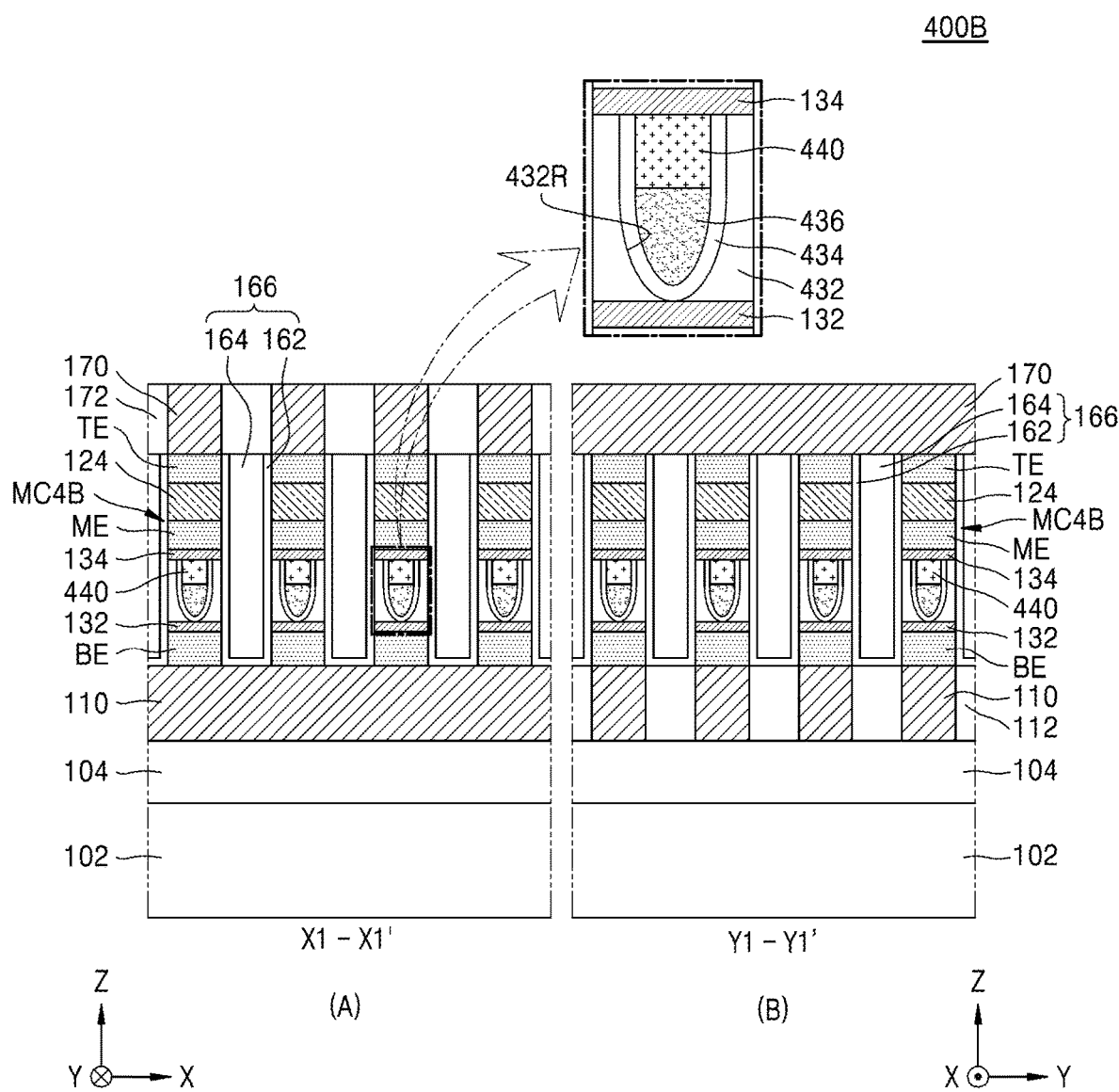
FIG. 9 is a cross-sectional view of a resistive memory device according to an embodiment.

FIG. 9 is a cross-sectional view of a resistive memory device 400B according to embodiments. In FIG. 9, the same reference numerals are used to denote the same elements as in FIG. 5A, and repeated descriptions thereof are omitted. In FIG. 9, part (A) illustrates some components of a portion corresponding to the cross-section taken along line X1-X1' of FIG. 4, and part (B) illustrates some components of a portion corresponding to the cross-section taken along line Y1-Y1' of FIG. 4.

Referring to FIG. 9, the resistive memory device 400B may have substantially the same configuration as the resistive memory device 100 described with reference to FIGS. 4, 5A, and 5B. However, the resistive memory device 400B may include a plurality of memory cells MC4B instead of the plurality of memory cells MC1.

The plurality of memory cells MC4B may have substantially the same configuration as the plurality of memory cells MC3 described with reference to FIG. 7. However, each of the plurality of memory cells MC4B may include a resistive memory pattern 440 instead of the resistive memory pattern 140. In each of the plurality of memory cells MC4B, an insulating spacer 432 defining a recess 432R, a barrier layer 434 conformally covering an inner wall of the recess 432R, a lower conductive pattern 436 filling a lower space of the recess 432R and on the barrier layer 434, and the resistive memory pattern 440 filling an upper space of the recess 432R and on the lower conductive pattern 436 and the barrier layer 434 may be between a lower barrier 132 and an upper barrier 134.

Figure 10A:
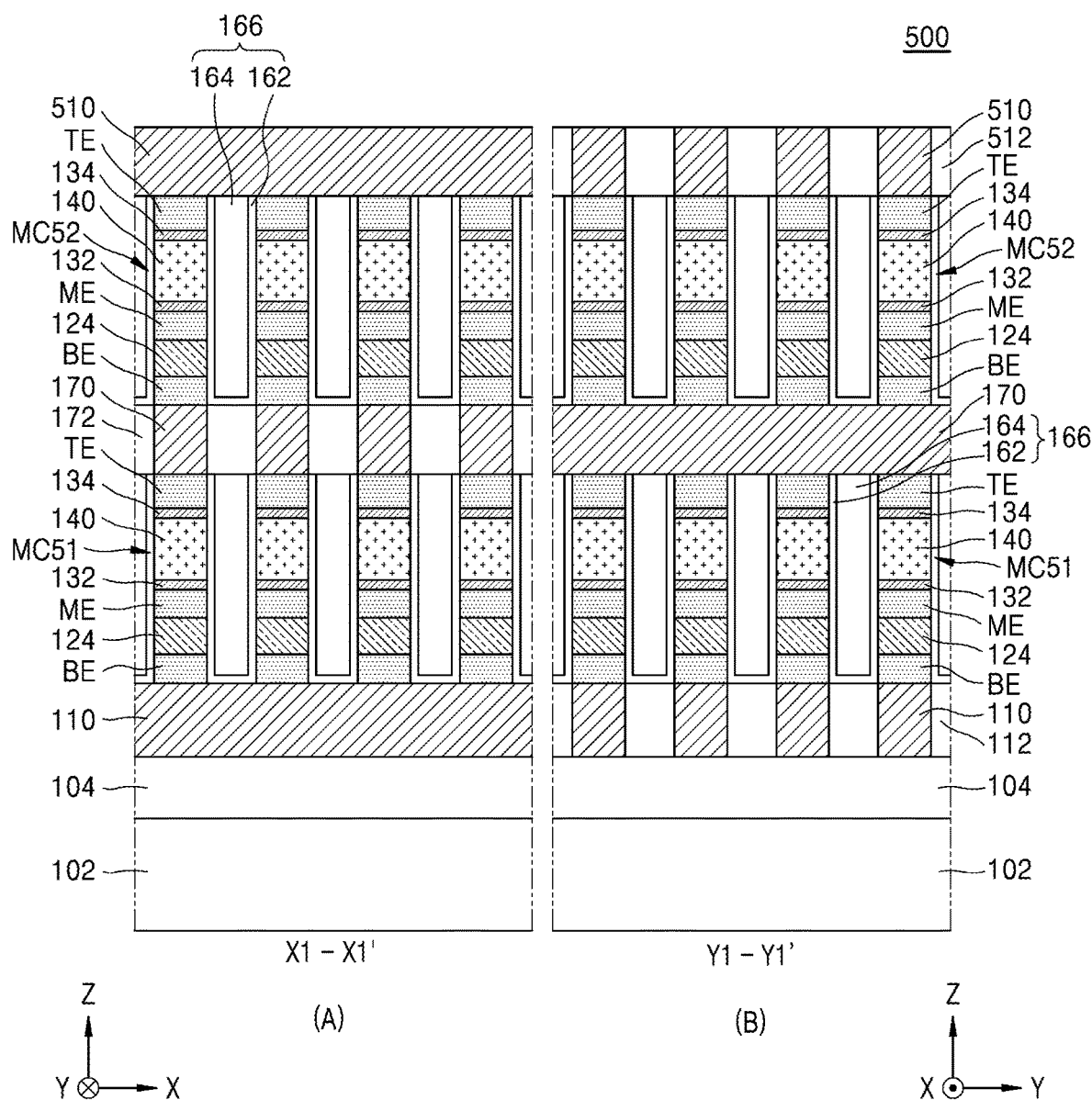
FIG. 10A is a cross-sectional view of a resistive memory device according to an embodiment.
Figure 10B:
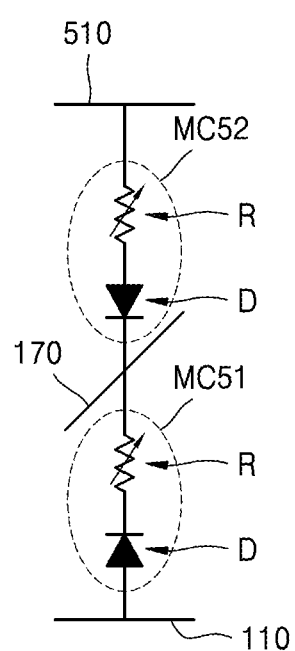
FIG. 10B is an equivalent circuit diagram of some memory cells of the resistive memory device shown in FIG. 10A.

FIG. 10A is a cross-sectional view of a resistive memory device 500 according to embodiments, and FIG. 10B is an equivalent circuit diagram of some memory cells included in the resistive memory device 500 shown in FIG. 10A. In FIGS. 10A and 10B, the same reference numerals are used to denote the same elements as in FIGS. 3 and 5A, and repeated descriptions thereof may be omitted. In FIG. 10A, part (A) illustrates some components of a portion corresponding to the cross-section taken along line X1-X1' of FIG. 4, and part (B) illustrates some components of a portion corresponding to the cross-section taken along line Y1-Y1' of FIG. 4.

Referring to FIGS. 10A and 10B, the resistive memory device 500 may include a plurality of first conductive lines 110 extending parallel to each other in a first lateral direction (X direction) on a substrate 102, a plurality of second conductive lines 170 extending parallel to each other in a second lateral direction (Y direction), and a plurality of third conductive lines 510 extending parallel to each other in the first lateral direction (X direction). A plurality of third insulating lines 512 may be respectively between the plurality of third conductive lines 510. The plurality of third insulating lines 512 may include a silicon oxide film, a silicon nitride film, or a combination thereof.

A plurality of first level memory cells MC51 may be respectively at a plurality of intersections between the plurality of first conductive lines 110 and the plurality of second conductive lines 170. A plurality of second level memory cells MC52 may be respectively at a plurality of intersections between the plurality of second conductive lines 170 and the plurality of third conductive lines 510. The plurality of first level memory cells MC51 may be formed at a different level or height from the plurality of second level memory cells MC52 in the vertical direction (Z direction). The plurality of first level memory cells MC51 and the plurality of second level memory cells MC52 may respectively have substantially the same configurations as the plurality of memory cells MC1 described with reference to FIG. 5A. An upper electrode TE of each of the plurality of second level memory cells MC52 may be connected to one third conductive line 510 selected from the plurality of third conductive lines 510.

The plurality of first conductive lines 110, the plurality of second conductive lines 170, and the plurality of third conductive lines 510 may respectively constitute a plurality of word lines or a plurality of bit lines. In an implementation, the plurality of first conductive lines 110 and the plurality of third conductive lines 510 may respectively constitute a plurality of bit lines, and each of the plurality of second conductive lines 170 may constitute a common word line. In an implementation, the plurality of first conductive lines 110 and the plurality of third conductive lines 510 may respectively constitute a plurality of word lines, and each of the plurality of second conductive lines 170 may constitute a common bit line. A constituent material of the plurality of third conductive lines 510 may be substantially the same as that of the plurality of first conductive lines 110 and the plurality of second conductive lines 170 described with reference to FIG. 5A.

The resistive memory device 500 may have a double stack structure including the plurality of first level memory cells MC51 and the plurality of second level memory cells MC52, which are formed at different levels in the vertical direction (Z direction). In an implementation, as illustrated in FIG. 10A, the plurality of first level memory cells MC51 and the plurality of second level memory cells MC52 may respectively have substantially the same configurations as the plurality of memory cells MC1 described with reference to FIG. 5A. In the resistive memory device 500 shown in FIG. 10A, each of the plurality of first level memory cells MC51 and the plurality of second level memory cells MC52 may include any one of the selection element patterns 224A, 224B, 224C, 224D, 224E, 224F, and 224G shown in FIGS. 6A to 6G and selection element patterns having structures obtained by making various modifications and changes.

Figure 11:
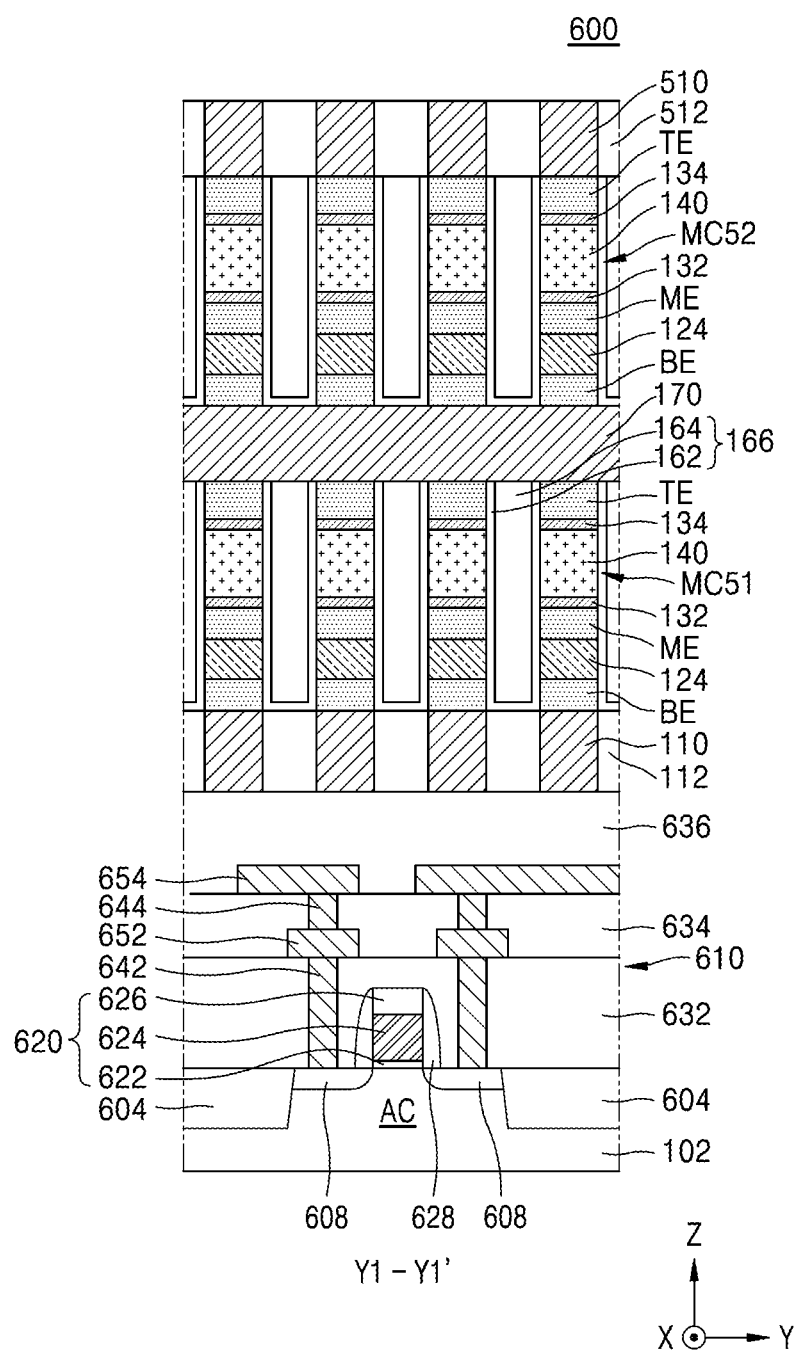
FIG. 11 is a cross-sectional view of a resistive memory device according to an embodiment.

FIG. 11 is a cross-sectional view of a resistive memory device 600 according to an embodiment. In FIG. 11, the same reference numerals are used to denote the same elements as in FIGS. 4 to 10B, and repeated descriptions thereof may be omitted. FIG. 11 illustrates some components of a portion corresponding to the cross-section taken along line Y1-Y1' of FIG. 4. At least some memory cells included in the resistive memory device 600 shown in FIG. 11 may have an equivalent circuit configuration shown in FIG. 10B.

Referring to FIG. 11, the resistive memory device 600 may have substantially the same configuration as the resistive memory device 500 described with reference to FIGS. 10A and 10B. The resistive memory device 600 may include a plurality of first level memory cells MC51 and a plurality of second level memory cells MC52, which are formed at different levels in the vertical direction (Z direction). In an implementation, unlike the resistive memory device 500 shown in FIG. 10A, the resistive memory device 600 may further include a lower structure 610, which is between a substrate 102 and a plurality of first conductive lines 110 and includes a plurality of transistors and a plurality of wirings.

The lower structure 610 may include peripheral circuits or driver circuits configured to drive the plurality of first level memory cells MC51 and the plurality of second level memory cells MC52. The lower structure 610 may include circuits configured to be capable of processing data input/output to/from the plurality of first level memory cells MC51 and the plurality of second level memory cells MC52 at high speed. In an implementation, the lower structure 610 may include circuits described with reference to FIG. 2, e.g., at least one of a row decoder RD, a column decoder CD, a control logic CL, a write/read circuit 14, a reference signal generator 16, and a power generator 18. The write/read circuit 14 may include a sense amplifier 14A and a write driver 14B. In an implementation, the lower structure 610 may include a page buffer, a latch circuit, a cache circuit, a sense amplifier, and a data in/out circuit.

Device isolation regions 604 defining a plurality of active regions AC may be in the substrate 102. The lower structure 610 may include a gate structure 620, a plurality of interlayer insulating films (e.g., 632, 634, and 636), a plurality of contact plugs (e.g., 642 and 644), and a plurality of wirings (e.g., 652 and 654), which are on the active region AC of the substrate 102. The gate structure 620 may include a gate insulating film 622, a gate 624, and an insulating capping layer 626, which are sequentially stacked on the active region AC of the substrate 102. Both sidewalls of the gate structure 620 may be covered by insulating spacers 628. The gate insulating film 622 may include silicon oxide or a metal oxide. The gate 624 may include doped polysilicon, a metal, a metal nitride, or a combination thereof. The insulating capping layer 626 may include a nitride film. The insulating spacers 628 may include an oxide film, a nitride film, or a combination thereof.

A pair of impurity regions 608 may be on both sides of the gate structure 620 in the active region AC of the substrate 102. The pair of impurity regions 608 may include N-type or P-type impurities. The gate structure 620 and the pair of impurity regions 608 on both sides of the gate structure 620 may constitute an NMOS transistor or a PMOS transistor depending on a type of impurities included in the pair of impurity regions 608.

The interlayer insulating film 632 may cover the gate structure 620, and the wiring 652 may be electrically connected to the impurity region 608 through the contact plug 642 that passes through the interlayer insulating film 632. The interlayer insulating film 634 may cover the wiring 652, and the wiring 654 may be electrically connected to the wiring 652 through the contact plug 644 that passes the interlayer insulating film 634. The interlayer insulating film 636 may be between the wiring 654 and the plurality of first conductive lines 110.

The interlayer insulating films 632, 634, and 636 may include an oxide film. Each of the contact plugs 642 and 644 and the wirings 652 and 654 may include a metal, a conductive metal nitride, or a combination thereof. In an implementation, the metal may be W, Al, Cu, or Ti.

A configuration of the lower structure 610 shown in FIG. 11 is merely an example and may be variously modified and changed. In an implementation, the lower structure 610 may include a single wiring structure or a multilayered wiring structure of three or more layers.

In an implementation, as illustrated in FIG. 11, a double stack structure including the plurality of first level memory cells MC51 and the plurality of second level memory cells MC52 shown in FIG. 10A may be on the lower structure 610. The resistive memory device 600 shown in FIG. 11 may include a single-layered structure or a double, four-layered, or six-layered structure including the memory cells included in the resistive memory devices 100, 200A, 200B, 200C, 200D, 200E, 200F, 200G, 300, 400A, and 400B described with reference to FIGS. 5A to 11B and memory cells having variously modified and changed structures instead of the double stack structure including the plurality of first level memory cells MC51 and the plurality of second level memory cells MC52.

Figure 12:
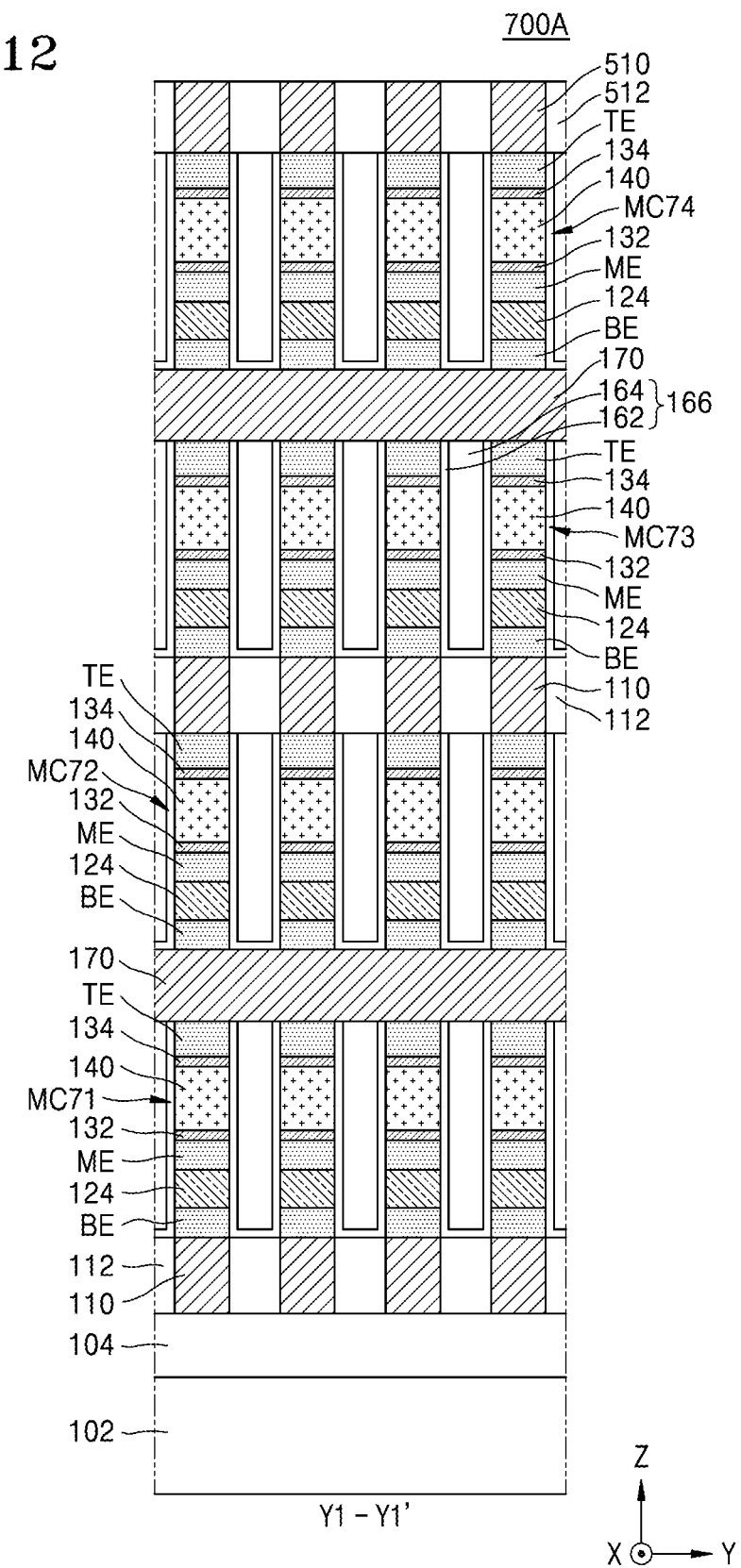
FIG. 12 is a cross-sectional view of a resistive memory device according to an embodiment.

FIG. 12 is a cross-sectional view of a resistive memory device 700A according to embodiments. In FIG. 12, the same reference numerals are used to denote the same elements as in FIGS. 4 to 11, and repeated descriptions thereof may be omitted. FIG. 12 illustrates some components of a portion corresponding to the cross-section taken along line Y1-Y1' of FIG. 4.

Referring to FIG. 12, the resistive memory device 700A may include a plurality of first level memory cells MC71, a plurality of second level memory cells MC72, a plurality of third level memory cells MC73, and a plurality of fourth level memory cells MC74, which are formed at different levels and stacked in the vertical direction (Z direction).

The plurality of first level memory cells MC71, the plurality of second level memory cells MC72, the plurality of third level memory cells MC73, and the plurality of fourth level memory cells MC74 may have the same structure as or a similar structure to that of the plurality of memory cells MC1 described with reference to FIG. 5A.

A plurality of first conductive lines 110 may be connected between a plurality of upper electrodes TE included in the plurality of second level memory cells MC72 and a plurality of lower electrodes BE included in the plurality of third level memory cells MC73. The upper electrode TE of each of the plurality of fourth level memory cells MC74 may be connected to one of a plurality of third conductive lines 510. In an implementation, as illustrated in FIG. 12, each of the plurality of first level memory cells MC71, the plurality of second level memory cells MC72, the plurality of third level memory cells MC73, and the plurality of fourth level memory cells MC74 may include the selection element pattern 124 described with reference to FIG. 5A. In an implementation, in the resistive memory device 700A shown in FIG. 12, each of the plurality of first level memory cells MC71, the plurality of second level memory cells MC72, the plurality of third level memory cells MC73, and the plurality of fourth level memory cells MC74 may have a structure of one of memory cells included in the resistive memory devices 200A, 200B, 200C, 200D, 200E, 200F, 200G, 300, 400A, and 400B described with reference to FIGS. 6A to 11B and memory cells having variously modified and changed structures.

Figure 13:
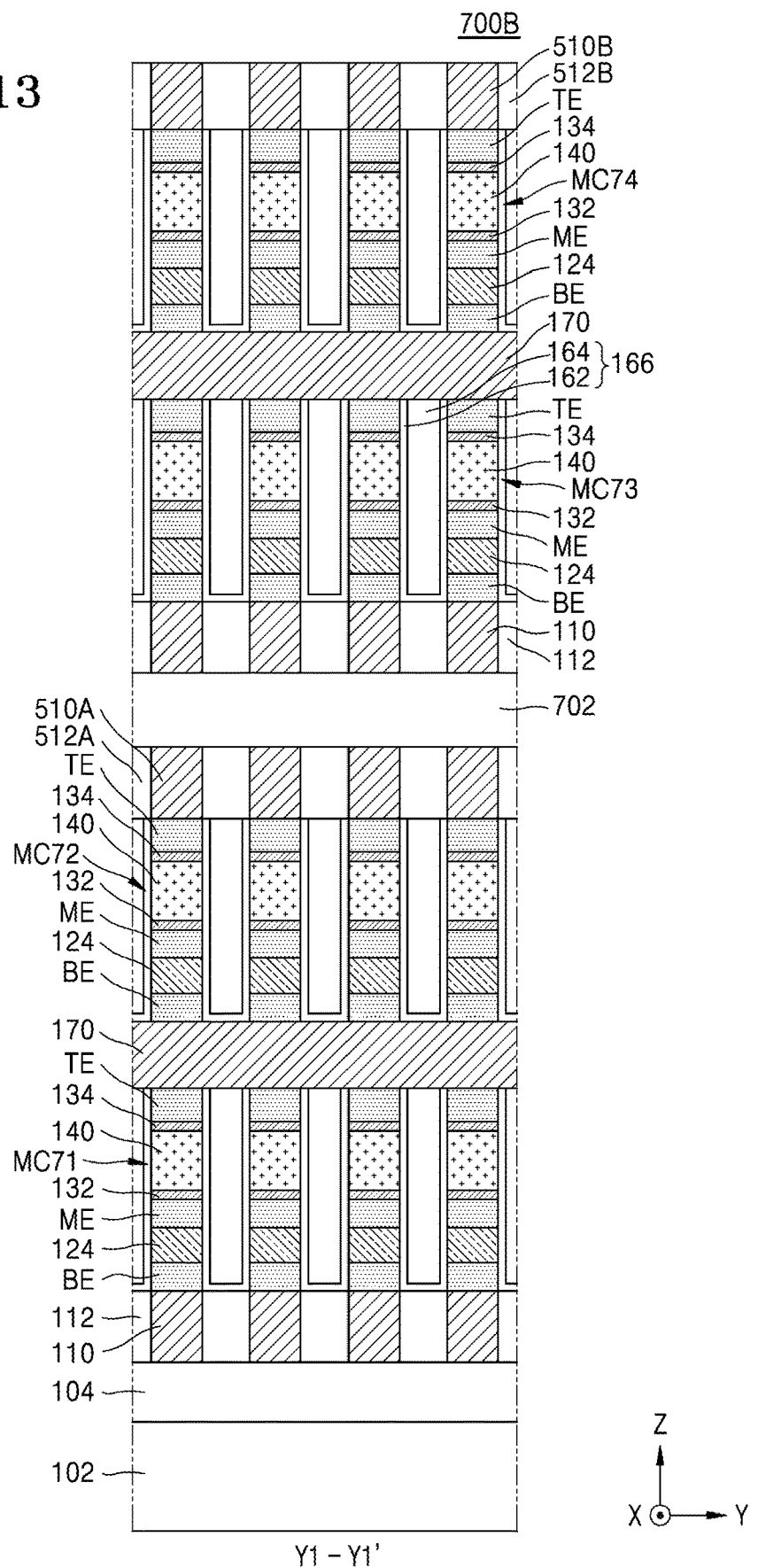
FIG. 13 is a cross-sectional view of a resistive memory device according to an embodiment.

FIG. 13 is a cross-sectional view of a resistive memory device 700B according to embodiments. In FIG. 13, the same reference numerals are used to denote the same elements as in FIGS. 4 to 11, and repeated descriptions thereof may be omitted. FIG. 13 illustrates some components of a portion corresponding to the cross-section taken along line Y1-Y1' of FIG. 4.

Referring to FIG. 13, the resistive memory device 700B may have substantially the same configuration as the resistive memory device 700A described with reference to FIG. 12. However, an upper electrode TE of each of a plurality of second level memory cells MC72 may be connected to one of a plurality of third conductive lines 510A. A plurality of third insulating lines 512A may be respectively between the plurality of third conductive lines 510A. An upper electrode TE of each of a plurality of fourth level memory cells MC74 may be connected to one of a plurality of third conductive lines 510B. A plurality of third insulating lines 512B may be respectively between the plurality of third conductive lines 510B. The third conductive lines 510A and 510B and the third insulating lines 512A and 512B may respectively have substantially the same configurations as the plurality of third conductive lines 510 and the plurality of third insulating lines 512 described with reference to FIGS. 10A and 10B.

An interlayer insulating film 702 may be between the plurality of third conductive lines 510A, which are respectively connected to a plurality of upper electrodes TE of the plurality of second level memory cells MC72, and the plurality of first conductive lines 110, which are respectively connected to the plurality of lower electrodes BE of the plurality of third level memory cells MC73. The interlayer insulating film 702 may include an oxide film, a nitride film, or a combination thereof.

<Evaluation Example>

Table 1 shows the results of an evaluation of physical properties and performance of a resistive memory device according to embodiments with respect to the composition of a selection element included in the resistive memory device.

TABLE 1

|  | Example 1 | Example 2 | Example 3 | Example 4 |
|---|---|---|---|---|
| $T_S$ (° C.) | 250 | 250 | 250 | 250 |
| $T_c$ (° C.) | 500 | 500 | 500 | 500 |
| Ioff(nA) | 0.2 | 0.4 | 0.5 | 0.8 |
| $V_{th}$ drift (mV/dec) | 51 | 49 | 20 | 20 |
| Endurance (Number of cycles) | ≥1E+11 | ≥1E+11 | ≥7E+10 | ≥7E+10 |

In Table 1, Example 1 shows a result of evaluating a selection element pattern including a compound represented by $Ge_xAs_ySe_zAl_a$ defined in Formula 1, Example 2 shows a result of evaluating a selection element pattern including a compound represented by $Ge_xAs_ySe_zSr_a$ defined in Formula 1, Example 3 shows a result of evaluating a selection element pattern including a compound represented by $Ge_xAs_ySe_zAl_aIn_b$ defined in Formula 2, and Example 4 shows a result of evaluating a selection element pattern including a compound represented by $Ge_xAs_ySe_zSr_aIn_b$ defined in Formula 2.

In the results of Table 1, a volatilization temperature Ts of each of the compounds according to Examples 1 to 4 was about 250° C. From the above results, it may be seen that the selection element patterns including the compounds according to Examples 1 to 4 exhibited sufficient volatilization temperature characteristics to be used as selection element patterns of resistive memory devices.

In the results of Table 1, a crystallization temperature Tc of each of the compounds according to Examples 1 to 4 was about 500° C. From the above results, it may be seen that the selection element patterns including the compounds according to Examples 1 to 4 exhibited sufficient crystallization temperature characteristics to be used as selection element patterns of resistive memory devices.

According to the results of evaluating threshold-voltage (Vth) drift characteristics in Table 1, in each of memory cells including the selection element patterns including the compounds according to Examples 1 to 4, a threshold-voltage (Vth) drift of about 20 mV/dec to about 51 mV/dec occurred, while a relatively low leakage current Ioff of about 0.2 nA to about 0.8 nA occurred.

In addition, according to the results of evaluating operating endurance in Table 1, in each of memory cells including the selection element patterns including the compounds according to Examples 1 to 4, the number of operation cycles until a threshold voltage Vth changed significantly was at least 1E+10. Accordingly, it may be seen that the memory cells had relatively excellent endurance.

As can be seen from the results of Table 1, in the resistive memory devices according to the Examples, the endurance of memory cells with respect to the operation time of a resistive memory device may be improved, power consumption may be minimized during the operations of the memory cells, and disturbance between adjacent ones of a plurality of memory cells may be minimized, thereby enabling stable cell operations. Accordingly, the reliability of the resistive memory device may be improved.

FIGS. 14A to 14G are cross-sectional views of stages in a method of manufacturing a resistive memory device, according to example embodiments. In each of FIGS. 14A to 14G, part (A) shows a cross-sectional view of some components of a portion corresponding to the cross-section taken along line X1-X1' of FIG. 4, according to a process sequence, and part (B) shows a cross-sectional view of some components of a portion corresponding to the cross-section taken along line Y1-Y1' of FIG. 4, according to a process sequence. A method of manufacturing the resistive memory device 100 shown in FIGS. 4, 5A, and 5B according to an example embodiment, will be described with reference to FIGS. 14A to 14G.

Figure 14A:
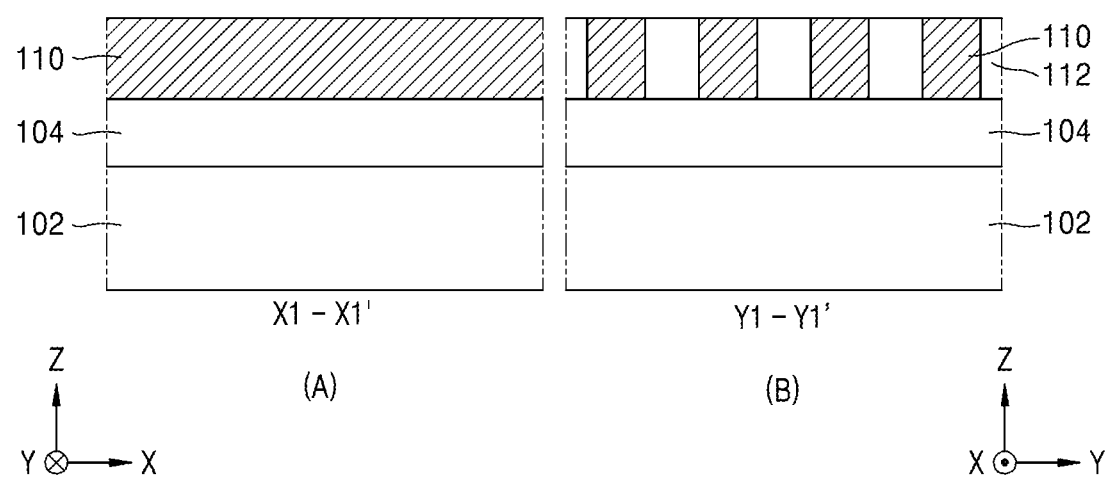
FIGS. 14A to 14G are cross-sectional views of a stages in a method of manufacturing a resistive memory device, according to example embodiments.

Referring to FIG. 14A, an interlayer insulating film 104 may be formed on a substrate 102, and a plurality of first conductive lines 110 and a plurality of first insulating lines 112 may be formed on the interlayer insulating film 104. The plurality of first insulating lines 112 may fill respective spaces between the plurality of first conductive lines 110.

Figure 14B:
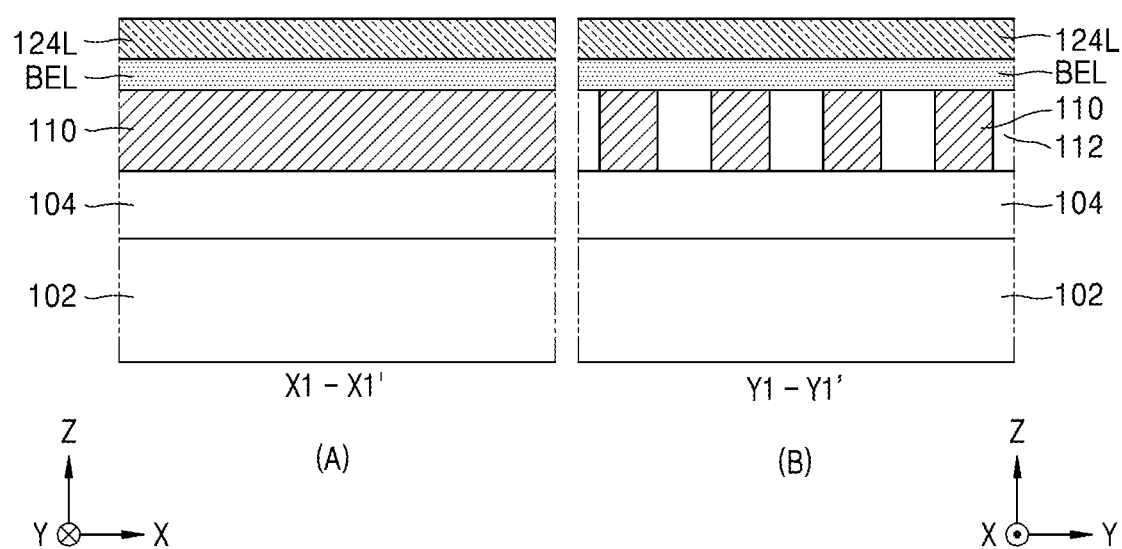

Referring to FIG. 14B, a lower electrode layer BEL may be formed on the plurality of first conductive lines 110 and the plurality of first insulating lines 112, and a selection element layer 124L may be formed on the lower electrode layer BEL. Constituent materials of the lower electrode layer BEL and the selection element layer 124L may be respectively the same as those of the lower electrode BE and the selection element pattern 124, which are described with reference to FIG. 5A.

In an implementation, to form the selection element layer 124L, a physical vapor deposition (PVD) process may be performed using at least one target including a chalcogenide switching material including Ge, As, and Se, and at least one metallic material, e.g., Al, Sr, or In. In an implementation, the at least one target may include a first target including both the chalcogenide switching material and the at least one metallic material. In an implementation, the at least one target may include a second target including Ge, As, Se, and an element (e.g., Sr or In) excluding Al, from among the at least one metallic material, and a third target including Al. In an implementation, the at least one target may include a fourth target including Ge, As, and Se, and a fifth target including at Al, Sr, or In. In an implementation, the at least one target may include a plurality of sixth targets including various combinations selected from Ge, As, Se, Al, Sr, and In.

By using the first to sixth targets simultaneously or by sequentially using at least some of the first to sixth targets, the selection element layer 124L for forming the selection element pattern 124 shown in FIGS. 5A and 5B may be formed, or a selection element layer for forming any one of the selection element patterns 224A to 224G shown in FIGS. 6A to 6G may be formed.

In an implementation, to form the selection element layer 124L, a chemical vapor deposition (CVD) process or an atomic layer deposition (ALD) process may be performed using a plurality of sources including a chalcogenide switching material including Ge, As, and Se, and at least one metallic material, e.g., Al, Sr, or In.

Figure 14C:
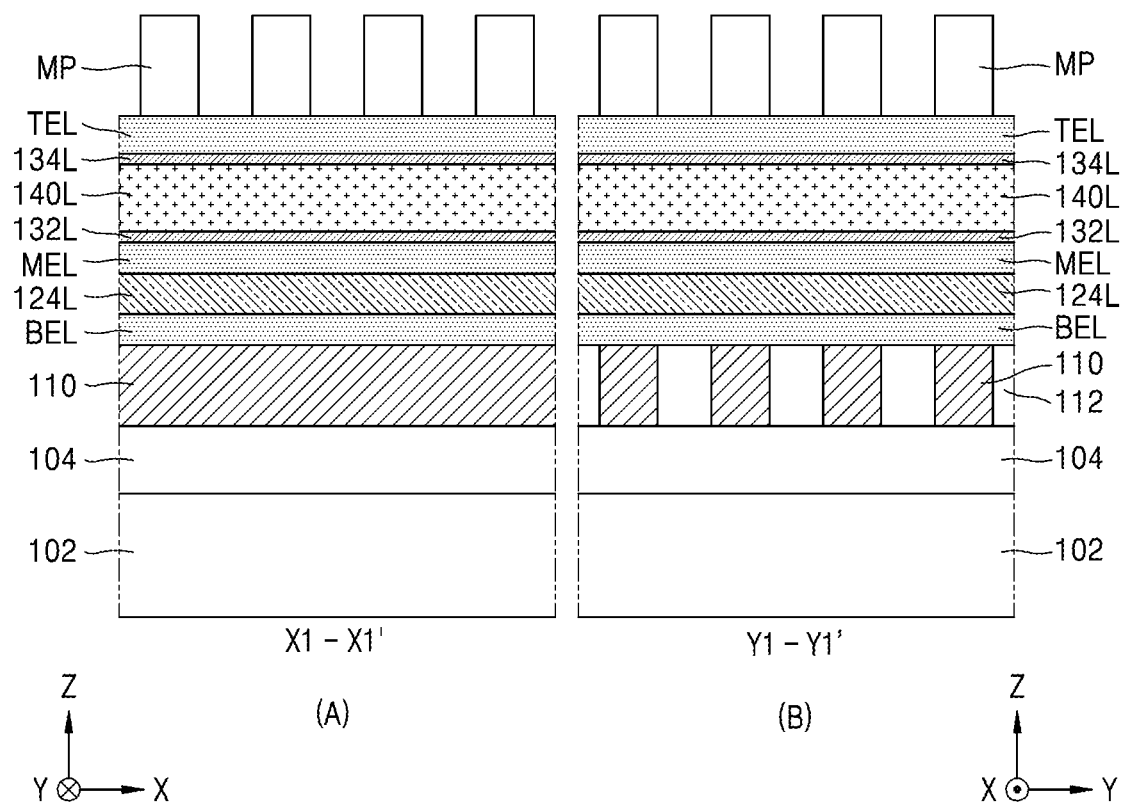

Referring to FIG. 14C, a middle electrode layer MEL, a lower barrier layer 132L, a resistive memory layer 140L, an upper barrier layer 134L, and an upper electrode layer TEL may be sequentially formed on the selection element layer 124L, and a mask pattern MP may be then formed on the upper electrode layer TEL.

Constituent materials of the middle electrode layer MEL, the lower barrier layer 132L, the resistive memory layer 140L, the upper barrier layer 134L, and the upper electrode layer TEL may be respectively the same as those of the middle electrode ME, the lower barrier 132, the resistive memory pattern 140, the upper barrier 134, and the upper electrode TE, which are described with reference to FIG. 5A.

The mask pattern MP may be formed to have a planar shape including a plurality of island patterns corresponding to positions of the plurality of memory cells MC1 shown in FIG. 4. In an implementation, the mask pattern MP may include a hard mask, which includes an oxide film, a nitride film, or a combination thereof. In an implementation, to form the mask pattern MP, a photolithography process may be performed by using extreme ultraviolet (EUV) (13.5 nm), a krypton fluoride (KrF) excimer laser (248 nm), an argon fluoride (ArF) excimer laser (193 nm), or a fluorine ($F_2$) excimer laser (157 nm) as a light source.

Figure 14D:
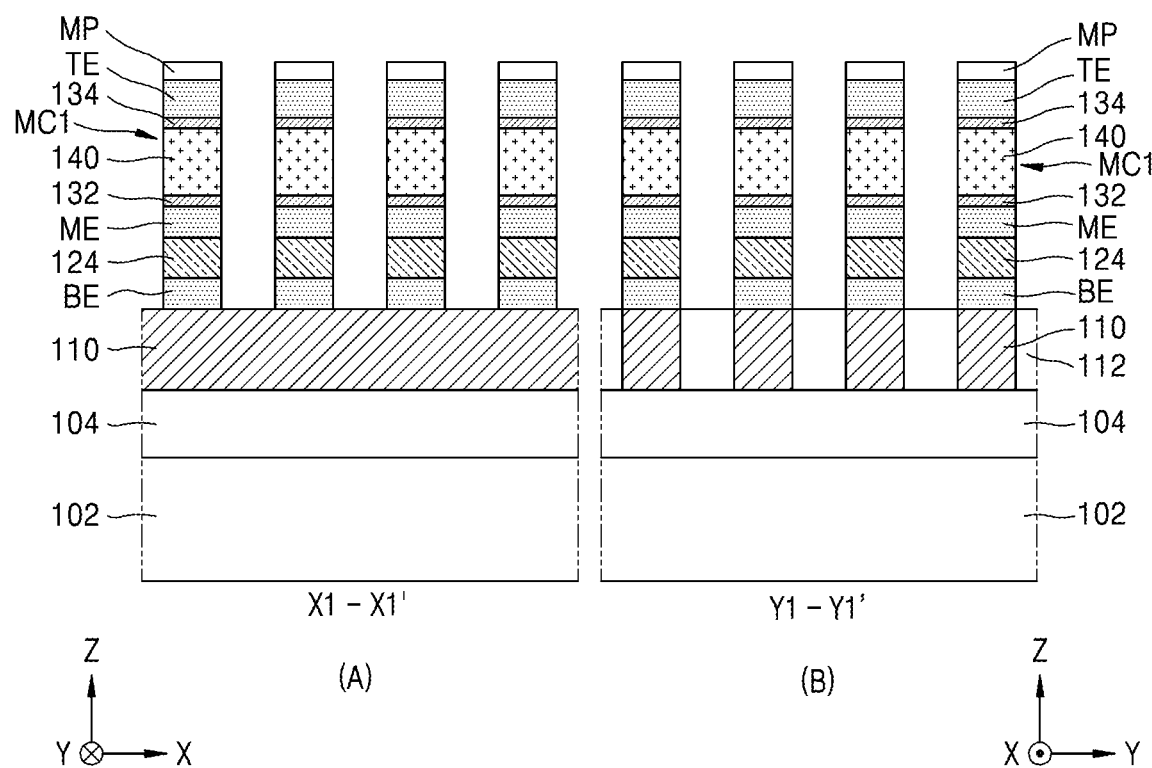

Referring to FIG. 14D, in the resultant structure of FIG. 14C, the upper electrode layer TEL, the upper barrier layer 134L, the resistive memory layer 140L, the lower barrier layer 132L, the middle electrode layer MEL, the selection element layer 124L, and the lower electrode layer BEL may be anisotropically etched using the mask pattern MP as an etch mask. Thus, the plurality of memory cells MC1, each of which includes a lower electrode BE, a selection element pattern 124, a middle electrode ME, a lower barrier 132, a resistive memory pattern 140, an upper barrier 134, and an upper electrode TE, may be formed. During the anisotropic etching process, a portion of the mask pattern MP may be consumed, and thus, a thickness of the mask pattern MP may be reduced.

While the lower electrode BE is being formed by anisotropically etching the lower electrode layer BEL in the process described with reference to FIG. 14D, over-etching may be performed. In this case, the plurality of first conductive lines 110 may be respectively exposed between the plurality of lower electrodes BE. By exposing the plurality of first conductive lines 110, which are exposed, to an anisotropic etching atmosphere, metal elements (e.g., W, Ti, or Cu) included in the plurality of first conductive lines 110 may be deposited on sidewalls of each of a plurality of selection element patterns 124. The deposited metal elements may penetrate into each of the plurality of selection element patterns 124 during a subsequent relatively high-temperature process. As a result, the plurality of selection element patterns 124 may have a structure including the W, Ti, or Cu.

Figure 14E:
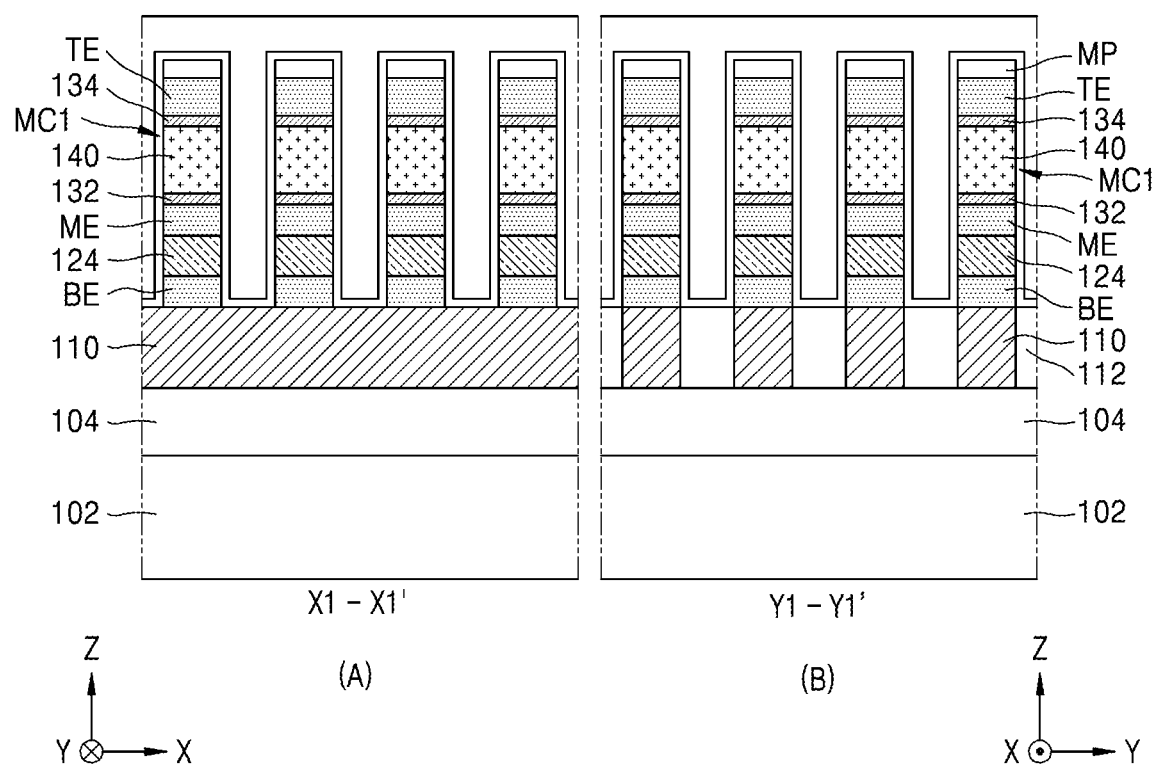

Referring to FIG. 14E, an encapsulation liner 162 may be formed to conformally cover exposed surfaces of the resultant structure of FIG. 14D, and a gap-fill insulating film 164 may be formed on the encapsulation liner 162 to fill respective spaces between the plurality of memory cells MC1.

In an implementation, to form the encapsulation liner 162, an ALD process or a CVD process may be performed at a relatively low temperature of about 250° C. or lower, e.g., about 60° C. to about 250° C. A lower process temperature for forming the encapsulation liner 162 may be advantageous in preventing the plurality of resistive memory patterns 140 from deteriorating during the formation of the encapsulation liner 162.

In an implementation, to form the gap-fill insulating film 164, a spin coating process, an ALD process, or a CVD process may be performed at a temperature of about 300° C. or lower, e.g., about 60° C. to about 300° C. A lower process temperature for forming the gap-fill insulating film 164 may be advantageous in preventing the plurality of resistive memory patterns 140 from deteriorating during the formation of the gap-fill insulating film 164.

Figure 14F:
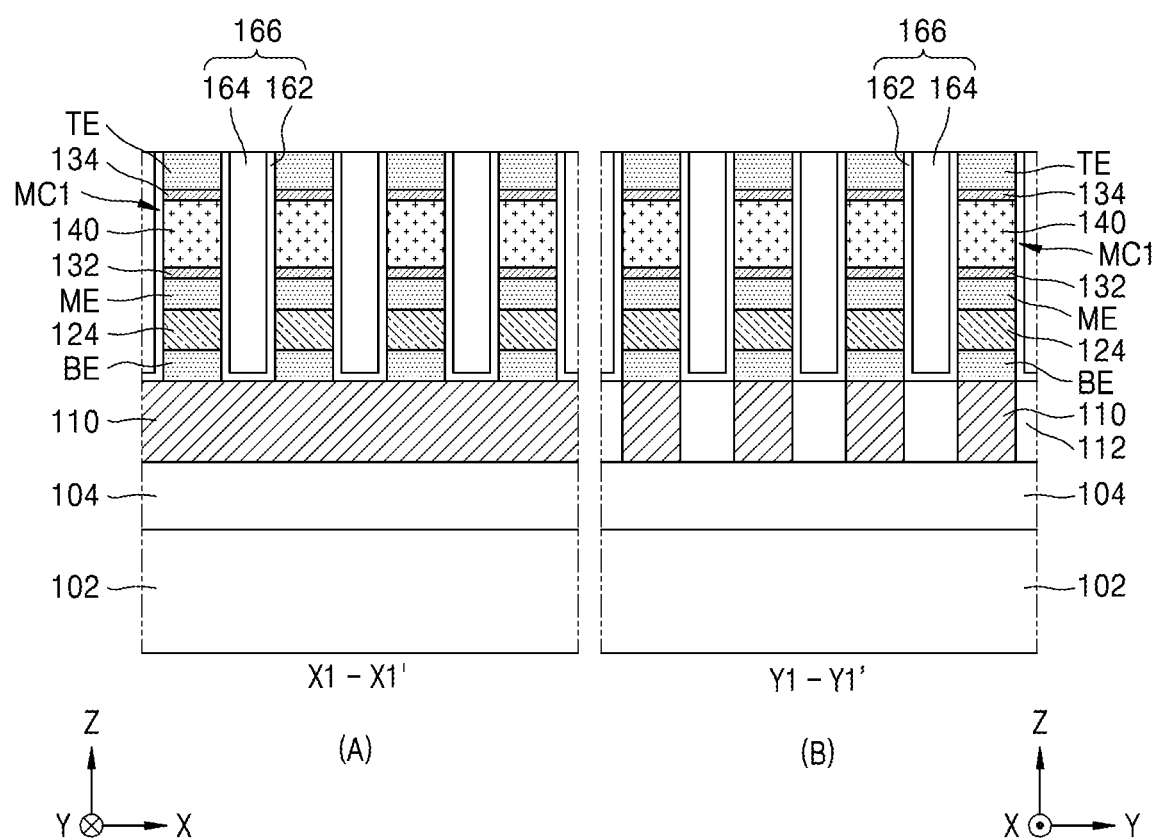

Referring to FIG. 14F, a top surface of the resultant structure of FIG. 14E may be planarized to expose a top surface of each of a plurality of upper electrodes TE. As a result, the mask pattern MP remaining in the resultant structure of FIG. 14E may be removed, and a level of a top surface of each of the encapsulation liner 162 and the gap-fill insulating film 164 may be lowered. The encapsulation liner 162 and the gap-fill insulating film 164, which remain between the plurality of memory cells MC1, may constitute the insulating structure 166.

Figure 14G:
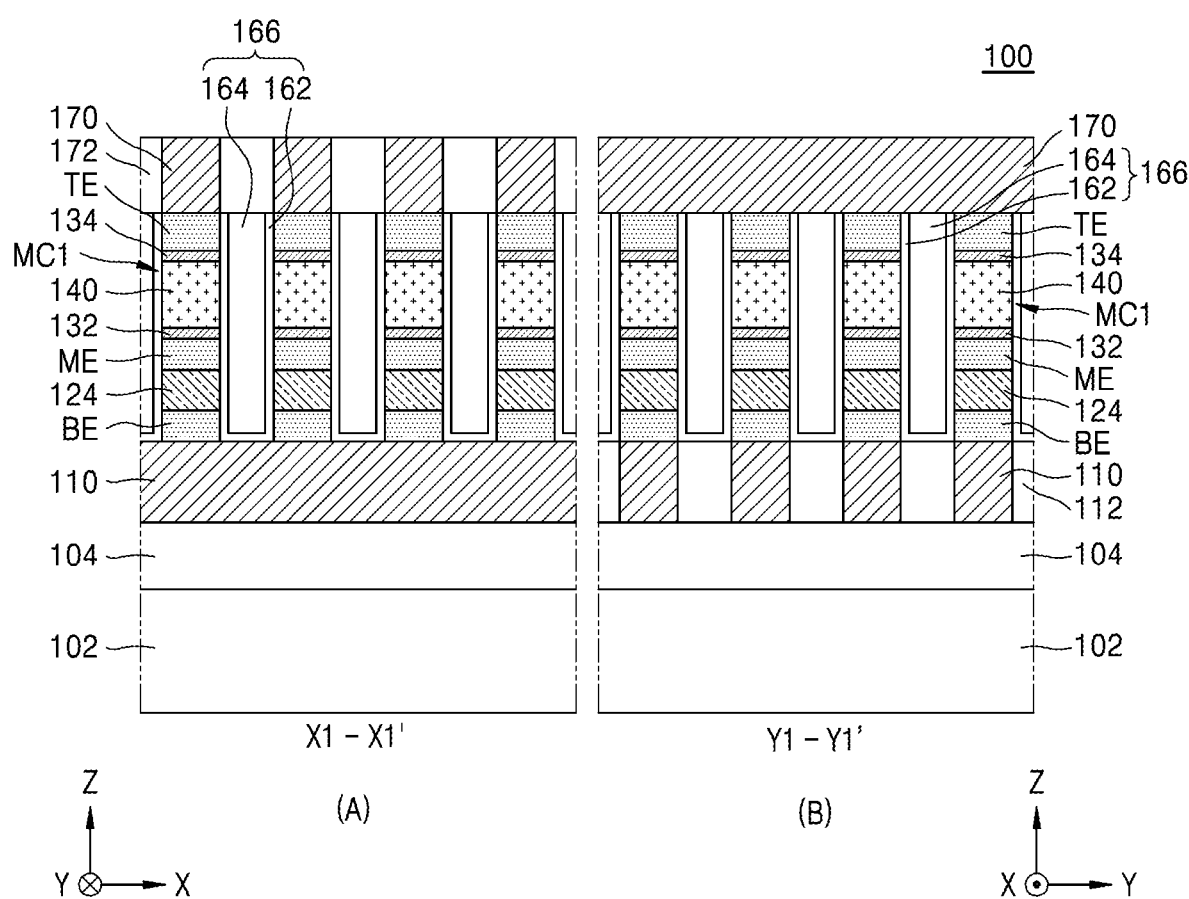

Referring to FIG. 14G, a conductive layer may be formed on the resultant structure of FIG. 14F and patterned to form a plurality of second conductive lines 170. Thereafter, a plurality of second insulating lines 172 may be formed to cover a top surface of the insulating structure 166 and a top surface of each of the plurality of memory cells MC1 between the plurality of second conductive lines 170.

The process described with reference to FIG. 14G may include forming, on the conductive layer, a hard mask pattern to be used as an etch mask to form the plurality of second conductive lines 170. A deposition process for forming the hard mask pattern may be performed at a relatively high temperature.

In an implementation, while the lower electrode BE is being formed by anisotropically etching the lower electrode layer BEL in the process described with reference to FIG. 14D, the metal element (e.g., W, Ti, or Cu) included in the plurality of first conductive lines 110 may be deposited on the sidewalls of each of the plurality of selection element patterns 124. In this case, when the deposition process for forming the hard mask pattern is performed at a relatively high temperature during the process described with reference to FIG. 14G, the metal element (e.g., W, Ti, or Cu) deposited on the sidewalls of each of the plurality of selection element patterns 124 may penetrate into each of the plurality of selection element patterns 124. As a result, the plurality of selection element patterns 124 may have a structure including W, Ti, or Cu.

Although a method of manufacturing the resistive memory device 100 shown in FIGS. 4, 5A, and 5B, according to an example embodiment, have been described with reference to FIGS. 14A to 14G, it will be understood that the resistive memory device 200A, 200B, 200C, 200D, 200E, 200F, 200G, 300, 400A, 400B, 500, 600, 700A, and 700B shown in FIGS. 6A to 13 or resistive memory devices having various structures may be manufactured by applying various modifications and changes to the method described with reference to FIGS. 14A to 14G.

By way of summation and review, high-speed and high-capacity resistive memory devices may be continuously required, and a device may have a structure that may increase the reliability and lifespan of a resistive memory device having a cross-point stack structure.

One or more embodiments may provide a resistive memory device having a cross-point array structure.

One or more embodiments may provide a resistive memory device configured to improve reliability and increase lifespan.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A resistive memory device, comprising:
a resistive memory pattern; and
a selection element pattern electrically connected to the resistive memory pattern, the selection element pattern including a chalcogenide switching material and at least one metallic material, the chalcogenide switching material including germanium, arsenic, and selenium, and the at least one metallic material including aluminum, strontium, or indium,
wherein the selection element pattern includes an inhomogeneous material layer in which content of the at least one metallic material in the selection element pattern is variable according to a position within the selection element pattern.

2. The resistive memory device as claimed in claim 1, wherein:
the selection element pattern includes a compound represented by Formula 1:

$$Ge_xAs_ySe_z(M1)_a \qquad \text{[Formula 1]}$$

in Formula 1,
M1 is aluminum or strontium, and
$0.13 \leq x \leq 0.23$, $0.25 \leq y \leq 0.35$, $0.38 \leq z \leq 0.50$, $0.001 \leq a \leq 0.06$, and $x+y+z+a=1$.

3. The resistive memory device as claimed in claim 1, wherein the selection element pattern includes a compound represented by $Ge_xAs_ySe_zAl_a$, in which $0.13 \leq x \leq 0.23$, $0.25 \leq y \leq 0.35$, $0.38 \leq z \leq 0.50$, $0.001 \leq a \leq 0.06$, and $x+y+z+a=1$.

4. The resistive memory device as claimed in claim 1, wherein the selection element pattern includes a compound represented by $Ge_xAs_ySe_zSr_a$, in which $0.13 \leq x \leq 0.23$, $0.25 \leq y \leq 0.35$, $0.38 \leq z \leq 0.50$, $0.001 \leq a \leq 0.06$, and $x+y+z+a=1$.

5. The resistive memory device as claimed in claim 1, wherein:
the selection element pattern includes a compound represented by Formula 2:

$$Ge_xAs_ySe_z(M1)_a(M2)_b \qquad \text{[Formula 2]}$$

in Formula 2,
M1 is aluminum or strontium,
M2 is indium, and
$0.13 \leq x \leq 0.23$, $0.25 \leq y \leq 0.35$, $0.38 \leq z \leq 0.50$, $0.001 \leq a \leq 0.08$, $0.001 \leq b \leq 0.06$, and $x+y+z+a+b=1$.

6. The resistive memory device as claimed in claim 1, wherein the selection element pattern includes a compound represented by $Ge_xAs_ySe_zAl_aIn_b$, in which $0.13 \leq x \leq 0.23$, $0.25 \leq y \leq 0.35$, $0.38 \leq z \leq 0.50$, $0.001 \leq a \leq 0.08$, $0.001 \leq b \leq 0.06$, and $x+y+z+a+b=1$.

7. The resistive memory device as claimed in claim 1, wherein the selection element pattern includes a compound represented by $Ge_xAs_ySe_zSr_aIn_b$, in which $0.13 \leq x \leq 0.23$, $0.25 \leq y \leq 0.35$, $0.38 \leq z \leq 0.50$, $0.001 \leq a \leq 0.08$, $0.001 \leq b \leq 0.06$, and $x+y+z+a+b=1$.

8. The resistive memory device as claimed in claim 1, wherein:
the selection element pattern further includes tungsten, titanium, or copper, and
a content of the tungsten, titanium, or copper in the selection element pattern is more than 0 atomic percent (at %) and less than 2 at %.

9. The resistive memory device as claimed in claim 1, wherein:
the selection element pattern includes a plurality of chalcogenide layers having different compositions,
the plurality of chalcogenide layers include a first chalcogenide layer and a second chalcogenide layer, which are at different heights from the resistive memory pattern,
the first chalcogenide layer does not include aluminum and does not include strontium, and
the second chalcogenide layer includes aluminum or strontium.

10. The resistive memory device as claimed in claim 1, wherein:
the selection element pattern includes a plurality of chalcogenide layers having different compositions,
the plurality of chalcogenide layers include a first chalcogenide layer, a second chalcogenide layer, and a third chalcogenide layer, which are at different heights from the resistive memory pattern,
the first chalcogenide layer does not include aluminum,
the second chalcogenide layer includes a first content of aluminum, and
the third chalcogenide layer includes a second content of aluminum, the second content being different from the first content.

11. The resistive memory device as claimed in claim 1, wherein the resistive memory pattern includes a chalcogenide material having a different composition from the chalcogenide switching material.

12. A resistive memory device, comprising:
a first conductive line extending lengthwise in a first lateral direction on a substrate;
a second conductive line extending lengthwise in a second lateral direction on the substrate, the second lateral direction intersecting with the first lateral direction; and
a memory cell at an intersection between the first conductive line and the second conductive line, the memory cell being connected between the first conductive line and the second conductive line,
wherein the memory cell includes:
a resistive memory pattern; and
a selection element pattern electrically connected to the resistive memory pattern, the selection element pattern includes a chalcogenide switching material and a metallic material, the chalcogenide switching material including germanium, arsenic, and selenium, and the metallic material including aluminum, strontium, or indium, and
wherein the selection element pattern includes an inhomogeneous material layer in which content of the metallic material is variable according to a position within the selection element pattern.

13. The resistive memory device as claimed in claim 12, wherein:
the selection element pattern includes a compound represented by Formula 1:

$Ge_xAs_ySe_z(M1)_a$ [Formula 1]

in Formula 1,
M1 is aluminum or strontium, and
$0.13 \leq x \leq 0.23$, $0.25 \leq y \leq 0.35$, $0.38 \leq z \leq 0.50$, $0.001 \leq a \leq 0.06$, and $x+y+z+a=1$.

14. The resistive memory device as claimed in claim 12, wherein:
the selection element pattern includes a compound represented by Formula 2:

$Ge_xAs_ySe_z(M1)_a(M2)_b$ [Formula 2]

in Formula 2,
M1 is aluminum or strontium,
M2 is indium, and
$0.13 \leq x \leq 0.23$, $0.25 \leq y \leq 0.35$, $0.38 \leq z \leq 0.50$, $0.001 \leq a \leq 0.08$, $0.001 \leq b \leq 0.06$, and $x+y+z+a+b=1$.

15. The resistive memory device as claimed in claim 12, wherein:
the selection element pattern further includes tungsten, titanium, or copper, and
a content of the tungsten, titanium, or copper in the selection element pattern is more than 0 atomic percent (at %) and less than 2 at %.

16. The resistive memory device as claimed in claim 12, wherein:
the selection element pattern includes a plurality of chalcogenide layers having different compositions,
the plurality of chalcogenide layers include a first chalcogenide layer closest to the resistive memory pattern and a second chalcogenide layer farthest from the resistive memory pattern,
the first chalcogenide layer does not include aluminum and does not include strontium, and
the second chalcogenide layer includes aluminum or strontium.

17. The resistive memory device as claimed in claim 12, wherein:
the selection element pattern includes a plurality of chalcogenide layers having different compositions,
the plurality of chalcogenide layers include a first chalcogenide layer, a second chalcogenide layer, and a third chalcogenide layer, which are at different heights from the resistive memory pattern,
the first chalcogenide layer does not include aluminum,
the second chalcogenide layer includes a first content of aluminum, and
the third chalcogenide layer includes a second content of aluminum, the second content being different from the first content.

18. A resistive memory device, comprising:
a first conductive line extending lengthwise in a first lateral direction on a substrate;
a plurality of second conductive lines extending lengthwise in a second lateral direction on the substrate, the plurality of second conductive lines being spaced apart from the first conductive line in a vertical direction, the second lateral direction intersecting with the first lateral direction;
a plurality of memory cells at a plurality of intersections between the first conductive line and the plurality of second conductive lines, the plurality of memory cells being arranged in a line in the first lateral direction on the first conductive line; and
an insulating structure covering sidewalls of each of the plurality of memory cells,
wherein each of the plurality of memory cells includes:
a resistive memory pattern; and
a selection element pattern electrically connected to the resistive memory pattern, the selection element pattern including a chalcogenide switching material including germanium, arsenic, and selenium, a first metallic material including aluminum, strontium, or indium, and a second metallic material including tungsten, titanium, or copper, and
wherein the selection element pattern includes an inhomogeneous material layer in which content of the first metallic material is variable according to a position within the selection element pattern.

19. The resistive memory device as claimed in claim 18, wherein:
the selection element pattern includes a plurality of chalcogenide layers having different compositions,
the plurality of chalcogenide layers includes a first chalcogenide layer and a second chalcogenide layer, which are at different heights from the resistive memory pattern,
the first chalcogenide layer does not include aluminum and does not include strontium, and
the second chalcogenide layer includes aluminum or strontium.

20. The resistive memory device as claimed in claim 18, wherein:
the selection element pattern includes a plurality of chalcogenide layers having different compositions,
the plurality of chalcogenide layers includes a first chalcogenide layer, a second chalcogenide layer, and a third chalcogenide layer, which are at different heights from the resistive memory pattern,
the first chalcogenide layer does not include aluminum,
the second chalcogenide layer includes a first content of aluminum, and
the third chalcogenide layer includes a second content of aluminum, the second content being different from the first content.

* * * * *